(12) United States Patent
Adut et al.

(10) Patent No.: US 11,277,106 B2
(45) Date of Patent: Mar. 15, 2022

(54) TRANSIMPEDANCE AMPLIFIERS WITH ADJUSTABLE INPUT RANGE

(71) Applicant: Analog Devices International Unlimited Company, Limerick (IE)

(72) Inventors: Joseph Adut, Palo Alto, CA (US);
Jeremy Wong, Sunnyvale, CA (US);
Eugene Cheung, Fremont, CA (US);
Brian Hamilton, Menlo Park, CA (US);
Gregory Fung, Fremont, CA (US)

(73) Assignee: ANALOG DEVICES INTERNATIONAL UNLIMITED COMPANY, Limerick (IE)

( * ) Notice: Subject to any disclaimer, the term of this patent is extended or adjusted under 35 U.S.C. 154(b) by 0 days.

(21) Appl. No.: 16/856,103

(22) Filed: Apr. 23, 2020

(65) Prior Publication Data

US 2021/0091734 A1    Mar. 25, 2021

Related U.S. Application Data

(60) Provisional application No. 62/905,772, filed on Sep. 25, 2019.

(51) Int. Cl.
*H03F 3/45* (2006.01)
*H03F 3/68* (2006.01)
(Continued)

(52) U.S. Cl.
CPC ......... *H03F 3/4517* (2013.01); *H03F 1/0211* (2013.01); *H03F 3/45269* (2013.01);
(Continued)

(58) Field of Classification Search
CPC ...................................................... H03F 3/451
See application file for complete search history.

(56) References Cited

U.S. PATENT DOCUMENTS

| 5,369,309 A | 11/1994 | Bacrania et al. |
| 5,371,552 A | 12/1994 | Brummette et al. |

(Continued)

FOREIGN PATENT DOCUMENTS

| EP | 0977535 | 2/2000 |
| EP | 3404831 | 11/2018 |

(Continued)

OTHER PUBLICATIONS

Office Action issued in DE Patent Application Serial No. 102020123378.7 dated Mar. 30, 2021, 8 pages.

(Continued)

*Primary Examiner* — Patricia T Nguyen
(74) *Attorney, Agent, or Firm* — Patent Capital Group

(57) ABSTRACT

A multi-stage transimpedance amplifier (TIA) with an adjustable input linear range is disclosed. The TIA includes a first stage, configured to convert a single-ended current signal from an optical sensor of a receiver signal chain to a single-ended voltage signal, and a second stage, configured to convert the single-ended voltage signal provided by the first stage to a differential signal. In such a TIA, the input linear range may be adjusted using a clamp that is programmable with an output offset current to keep the second stage of the TIA from overloading and to maintain a linear transfer function without compression.

24 Claims, 14 Drawing Sheets

(51) Int. Cl.
 *H03F 1/02* (2006.01)
 *H03M 1/12* (2006.01)
 *G01S 7/486* (2020.01)
(52) U.S. Cl.
 CPC ............... *H03F 3/68* (2013.01); *H03M 1/12* (2013.01); *G01S 7/4868* (2013.01); *H03F 2203/45601* (2013.01)

(56) References Cited

U.S. PATENT DOCUMENTS

| | | | |
|---|---|---|---|
| 5,859,569 | A | 1/1999 | Le et al. |
| 6,876,259 | B2 | 4/2005 | Visocchi |
| 7,474,247 | B1 | 1/2009 | Heinks et al. |
| 7,605,660 | B1* | 10/2009 | Kobayashi ............ H03F 1/083 330/254 |
| 7,724,061 | B2 | 5/2010 | Chon et al. |
| 8,446,203 | B1 | 5/2013 | Adut |
| 10,211,792 | B2* | 2/2019 | Frohlich ................. H04R 3/06 |
| 10,211,846 | B1 | 2/2019 | Phillips |
| 2003/0106989 | A1* | 6/2003 | Bloehbaum ......... H03F 3/45475 250/214 A |
| 2003/0197563 | A1 | 10/2003 | Nishizono |
| 2003/0218508 | A1 | 11/2003 | Chiou et al. |
| 2005/0052247 | A1* | 3/2005 | Visocchi ................. H03F 3/08 330/308 |
| 2008/0284522 | A1* | 11/2008 | Denoyer ............ H03G 3/3084 330/308 |
| 2008/0309407 | A1* | 12/2008 | Nakamura ............. H03F 3/087 330/253 |
| 2015/0365060 | A1 | 12/2015 | Tsunetsugu |
| 2018/0275250 | A1 | 9/2018 | Adut |
| 2018/0284229 | A1 | 10/2018 | Liu et al. |
| 2018/0284272 | A1 | 10/2018 | Adut |
| 2019/0253030 | A1 | 8/2019 | Eken |

FOREIGN PATENT DOCUMENTS

| | | |
|---|---|---|
| JP | 2003-318681 | 11/2003 |
| JP | 2004-228243 | 8/2004 |
| JP | 2006-333204 | 12/2006 |
| JP | 2009-212702 | 9/2009 |
| JP | 2016-001803 | 1/2016 |

OTHER PUBLICATIONS

Ardizzoni et al., "Rules of the Road" for High-Speed Differential ADC Drivers, Analog Dialogue 43-05, May 2009, 11 pages.
MAX40658/MAX40659, *Transimpedance Amplifier with 100mA Input Current Clamp for LiDAR Applications*, Maxim Integration, Jun. 2018, 13 pages.
English Abstract for JP2009-212702, 1 page.
English Abstract for JP2016-001803, 1 page.
English Abstract for JP2004-228243, 1 page.
English Abstract for JP2006-333204, 1 page.

* cited by examiner ized TRANSIMPEDANCE AMPLIFIERS WITH ADJUSTABLE INPUT RANGE

CROSS REFERENCE TO RELATED APPLICATIONS

This application is related to U.S. Patent Application No. 62/905,772, filed Sep. 25, 2019, titled "TRANSIMPEDANCE AMPLIFIER WITH ADJUSTABLE INPUT RANGE," the disclosure of which is hereby incorporated by reference herein in its entirety.

TECHNICAL FIELD OF THE DISCLOSURE

The present disclosure relates generally to electronics and, more specifically, to transimpedance amplifiers.

BACKGROUND

Light detection and ranging (LIDAR) refers to a surveying method that measures distance to a target object by illuminating the object with light (e.g., with pulses of light, e.g., pulses of laser light) and measuring the reflected light with an optical sensor such as an Avalanche Photo Diode (APD). Differences in laser return times and wavelengths can then be used to determine the distance to the object and/or make digital three-dimensional representations of the object. LIDAR systems are used in a variety of situations. For example, LIDAR systems can be used with airplanes, automobiles, binoculars or monoculars, etc.

A conventional receiver chain of a LIDAR system may include a sequence of an optical sensor that receives/detects optical pulses and converts them to electrical current, a transimpedance amplifier (TIA) that converts current signals from the optical sensor into voltage signals, and an analog-to-digital converter (ADC) that converts the voltage signals from the TIA to digital signals for further processing. Some ADCs operate better when the input signals provided to them are differential signals. However, the optical sensor typically generates current only in one direction and, therefore, the optical sensor output is typically single-ended. Therefore, a LIDAR system may include a circuit configured to convert a single-ended voltage output from the TIA to a differential signal which may then be provided as an input to the ADC. Such a circuit may be a part of an ADC driver, which is an electronic component configured to perform signal conditioning for an ADC. Such a circuit may also be considered as a second stage of a TIA (i.e., the first stage converts current signals from the optical sensor into single-ended voltage signals, and the second stage converts single-ended voltage signals to differential signals).

An ADC driver may be a key factor in enabling an ADC to achieve its desired performance. First of all, the ADC driver, which is typically operated at a higher supply voltage than the ADC, should ensure that the driver's maximum output never exceeds the ADC's supply to protect to ADC from permanent damage. Second, the ADC driver should condition its outputs as not to overload the ADC. An ADC may be overloaded when the outputs from an ADC driver exceed the minimum and maximum voltages within the ADC's full-scale range. High-speed ADCs, for example those used as modern pipeline converters, may also overload if the common-mode voltage of the input signals provided to the ADCs are not maintained in a narrow band (e.g., less than 100 millivolts (mV)) around the input common-mode voltage of the ADC.

In addition to the dangers of the ADC being overloaded, the TIA and the single-to-differential conversion circuit in the signal path to the ADC may also be overloaded when inputs to these circuits exceed certain limits. Overload conditions to any of these components of the receiver chain are highly undesirable because it may take several microseconds or even milliseconds before the receiver recovers from the overload, during which time the receiver may not be able to process the input signals, i.e., the receiver is, effectively, temporarily disabled. A receiver being temporarily disabled may be absolutely critical in applications such as LIDAR systems because it means that the LIDAR system is blind to its surroundings until the receiver recovers from the overload.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

Figure 1:
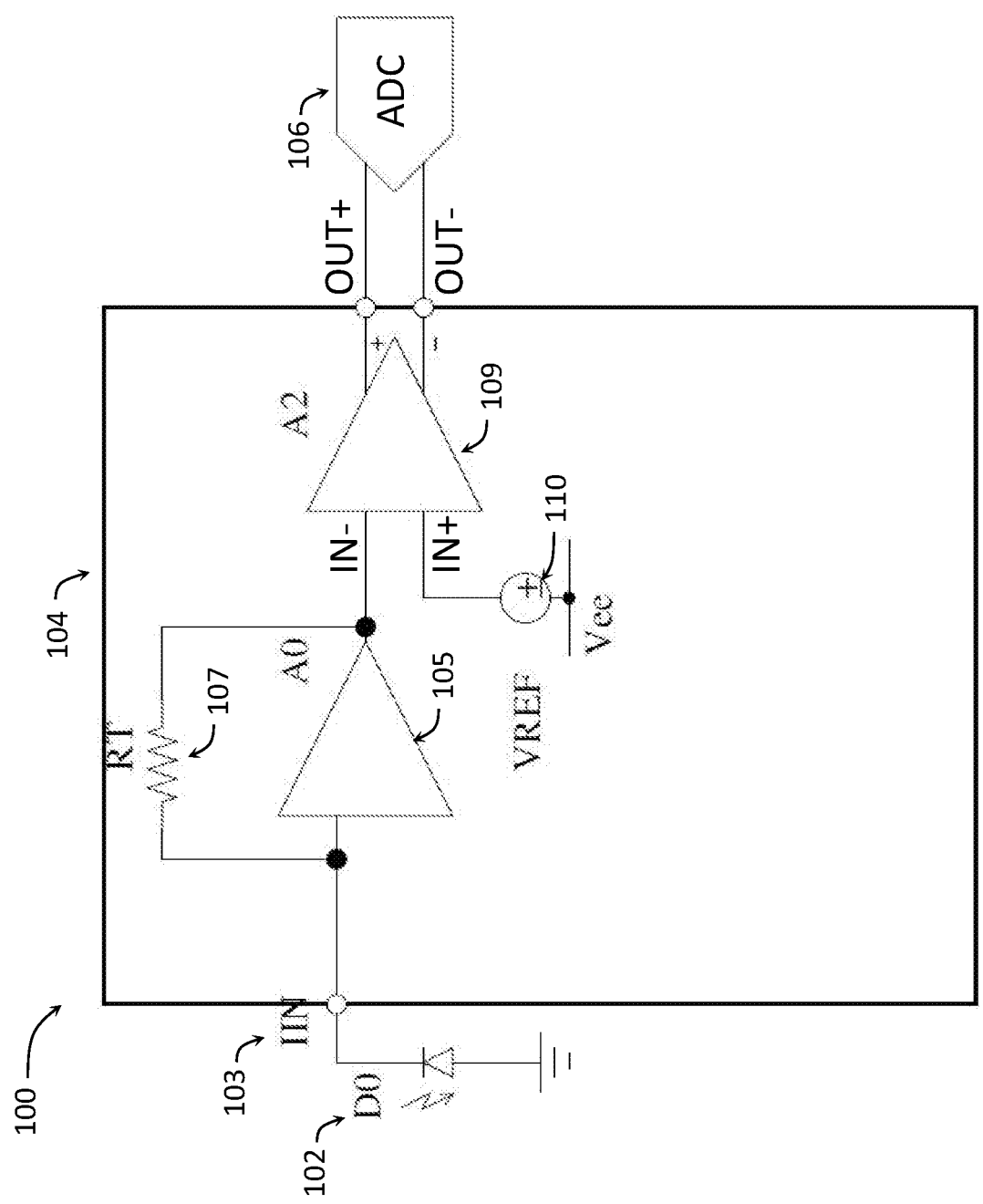
FIG. 1 is an electric circuit diagram showing a LIDAR receiver.

DESCRIPTION OF EXAMPLE EMBODIMENTS
OF THE DISCLOSURE

Overview

The systems, methods and devices of this disclosure each have several innovative aspects, no single one of which is solely responsible for the all of the desirable attributes disclosed herein. Details of one or more implementations of the subject matter described in this specification are set forth in the description below and the accompanying drawings.

Some aspects of the present disclosure relate to multi-stage TIAs with adjustable input linear ranges. An example TIA includes a first stage and a second stage. The first stage is configured to convert a single-ended current input signal to a single-ended output voltage signal. In some embodiments, the single-ended current input signal may be, but is not limited to, a current signal received from an optical sensor of a receiver signal chain of a LIDAR system. The second stage is configured to convert the single-ended output voltage signal generated by the first stage to a differential voltage output signal. To that end, the second stage is configured to receive a differential input via two inputs: a first input (e.g., a negative input, denoted herein as "IN−") and a second input (e.g., a positive input, denoted herein as "IN+"). The first differential input of the second stage is configured to receive a signal based on the single-ended voltage signal generated by the first stage. The second differential input of the second stage is configured to receive a signal based on an output offset current for the second stage. The second stage is further configured to provide a differential output via two outputs: a first output (e.g., a negative output, denoted herein as "OUT−") and a second output (e.g., a positive output, denoted herein as "OUT+"). In such a TIA, the input linear range of the second stage may be adjusted by using a clamp circuit at/in (or associated with) the output of the first stage to keep the second stage of the TIA, as well as the subsequent ADC, from overloading and to help ensure that the second stage has a linear transfer function substantially without compression.

In various embodiments, the clamp circuit may be either a high-side clamp circuit or a low-side clamp circuit. As is known in the art and used herein, "high-side clamping" of a signal refers to making sure that an amplitude of the signal does not exceed a maximum value set by a circuit referred to as a "high-side clamp circuit" or, simply, a "high-side clamp." Similarly, as is known in the art and used herein, "low-side clamping" of a signal refers to making sure that an amplitude of the signal does not fall below a minimum value set by a circuit referred to as a "low-side clamp circuit" or, simply, a "low-side clamp." When triggered, the clamp circuit of any of the multi-stage TIAs described herein can ensure that the voltage of the signal at the first differential input is in accordance with the clamp value, i.e., that said voltage does not exceed the maximum voltage value if the clamp circuit is a high-side clamp circuit, or does not fall below the minimum voltage value if the clamp circuit is a low-side clamp circuit.

In some embodiments, the clamp circuit may be programmable using the output offset current, meaning that the clamp value imposed by the clamp circuit may be based on (e.g., may depend on or may be computed from) the output offset current for the second stage. Thus, when the clamp circuit of the multi-stage TIAs described herein is a high-side clamp, the maximum value set/imposed by the clamp circuit on the single-ended output voltage signal from the first stage may be based on the output offset current for the second stage. On the other hand, when the clamp circuit is a low-side clamp, the minimum value set/imposed by the clamp circuit on the single-ended output voltage signal from the first stage may be based on the output offset current for the second stage. Irrespective of whether the clamp circuit is a high-side or a low-side clamp, because the second input of the differential input of the second stage receives a signal based on the output offset current, and because the first input of the differential input of the second stage receives a clamped version of the single-ended output voltage signal from the first stage where the clamping is also based on the output offset current, the multi-stage TIA can advantageously ensure that the differential input of the second stage, as well as the subsequent ADC, is not overloaded.

In some implementations, the second stage of the multi-stage TIA disclosed herein may be considered to be a part of an ADC driver.

Some example implementations of multi-stage TIAs with adjustable input range are shown in FIGS. 5-14. However, any implementation of the multi-stage TIAs with adjustable input range in line with the descriptions provided herein is within the scope of the present disclosure.

Other aspects of the present disclosure provide systems, e.g., LIDAR systems (in particular, LIDAR receivers), that may include one or more multi-stage TIAs with adjustable input range implemented using programmable clamp circuits as described herein, as well as methods for operating such systems and methods for determining distance to at least one object using such systems. While some embodiments of the present disclosure refer to LIDAR as example systems in which multi-stage TIAs with adjustable input range as described herein may be implemented, in other embodiments, multi-stage TIAs as described herein may be implemented in systems other than LIDAR, all of which embodiments being within the scope of the present disclosure. Furthermore, while some embodiments of the present disclosure describe multi-stage TIAs with adjustable input range receiving a single-ended current input from an optical sensor, all of the multi-stage TIAs as described herein may be used in systems where the single-ended current input is provided from any other source or electronic component. Similarly, while some embodiments of the present disclosure describe multi-stage TIAs with adjustable input range providing a differential voltage output to an ADC, all of the multi-stage TIAs as described herein may be used in systems where the differential voltage output is provided from the multi-stage TIA to any other electronic component besides the ADC. Still further, arrangements that convert a single-ended signal to a differential signal using an output offset current and clamping the single-ended signal based on the value of the output offset current, as described herein, may be used in systems other than LIDAR systems, ADC drivers, and TIAs, all of which embodiments being within the scope of the present disclosure.

The exact design of multi-stage TIAs with adjustable input range, described herein, may be realized in many different ways, all of which being within the scope of the present disclosure. In one example of design variations according to various embodiments of the present disclosure, a choice can be made, individually for each of the transistors of a multi-stage TIA with adjustable input range, to employ bipolar transistors (e.g., where various transistors may be NPN or PNP transistors), field-effect transistors (FETs), e.g., metal-oxide-semiconductor (MOS) technology transistors (e.g., where various transistors may be N-type MOS (NMOS) or P-type MOS (PMOS) transistors), or a combination of one or more FETs and one or more bipolar transistors. In view of that, in the following descriptions, transistors are sometimes described with reference to their first, second, and third terminals. The term "first terminal" of a transistor is used to refer to an emitter terminal if the transistor is a bipolar transistor or to a source terminal if the transistor is a FET, the term "second terminal" of a transistor is used to refer to a collector terminal if the transistor is a bipolar transistor or to a drain terminal if the transistor is a FET, and the term "third terminal" of a transistor is used to refer to a base terminal if the transistor is a bipolar transistor or to a gate terminal if the transistor is a FET. These terms remain the same irrespective of whether a transistor of a given technology is an N-type transistor (e.g., an NPN transistor if the transistor is a bipolar transistor or an NMOS transistor if the transistor is a FET) or a P-type transistor (e.g., a PNP transistor if the transistor is a bipolar transistor or a PMOS transistor if the transistor is a FET). In another example, in various embodiments, a choice can be made, individually for each of the transistors of a multi-stage TIA with adjustable input range, as to which transistors are implemented as N-type transistors (e.g., NMOS transistors for the transistors implemented as FETs, or NPN transistors for the transistors implemented as bipolar transistors) and which transistors are implemented as P-type transistors (e.g., PMOS transistors for the transistors implemented as FETs, or PNP transistors for the transistors implemented as bipolar transistors). In yet other examples, in various embodiments, a choice can be made as to what type of transistor architecture to employ. For example, any of the transistors of the multi-stage TIAs with adjustable input range as described herein that are implemented as FETs may be planar transistors or may be non-planar transistors (some examples of the latter including FinFETs, nanowire transistors or nanoribbon transistors).

As will be appreciated by one skilled in the art, aspects of the present disclosure, in particular aspects of multi-stage TIAs with adjustable input range as proposed herein, may be embodied in various manners—e.g. as a method, a system, a computer program product, or a computer-readable storage medium. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Functions described in this disclosure may be implemented as an algorithm executed by one or more hardware processing units, e.g. one or more microprocessors, of one or more computers. In various embodiments, different steps and portions of the steps of each of the methods described herein may be performed by different processing units. Furthermore, aspects of the present disclosure may take the form of a computer program product embodied in one or more computer readable medium(s), preferably non-transitory, having computer readable program code embodied, e.g., stored, thereon. In various embodiments, such a computer program may, for example, be downloaded (updated) to the existing devices and systems (e.g., to the existing receivers, LIDAR systems, and/or their controllers, etc.) or be stored upon manufacturing of these devices and systems.

The following detailed description presents various descriptions of specific certain embodiments. However, the innovations described herein can be embodied in a multitude of different ways, for example, as defined and covered by the select examples. In the following description, reference is made to the drawings where like reference numerals can indicate identical or functionally similar elements. It will be understood that elements illustrated in the drawings are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The description may use the phrases "in an embodiment" or "in embodiments," which may each refer to one or more of the same or different embodiments. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner. Furthermore, for the purposes of the present disclosure, the phrase "A and/or B" or notation "A/B" means (A), (B), or (A and B), while the phrase "A, B, and/or C" means (A), (B), (C), (A and B), (A and C), (B and C), or (A, B, and C). As used herein, the notation "A/B/C" means (A, B, and/or C). The term "between," when used with reference to measurement ranges, is inclusive of the ends of the measurement ranges.

Various aspects of the illustrative embodiments are described using terms commonly employed by those skilled in the art to convey the substance of their work to others skilled in the art. For example, the term "connected" means a direct electrical connection between the things that are connected, without any intermediary devices/components, while the term "coupled" means either a direct electrical connection between the things that are connected, or an indirect electrical connection through one or more passive or active intermediary devices/components. In another example, the term "circuit" means one or more passive and/or active components that are arranged to cooperate with one another to provide a desired function. Sometimes, in the present descriptions, the term "circuit" may be omitted (e.g., a clamp circuit may be referred to simply as a "clamp," etc.). If used, the terms "substantially," "approximately," "about," etc., may be used to generally refer to being within +/−20% of a target value, e.g., within +/−10% of a target value, based on the context of a particular value as described herein or as known in the art.

Foundation of Multi-Stage TIAs

For purposes of illustrating multi-stage TIAs with adjustable input range realized using programmable clamp circuits proposed herein, it might be useful to first understand settings in which multi-stage TIAs may be used, as well as phenomena that may come into play when such TIAs are used. The following foundational information may be viewed as a basis from which the present disclosure may be properly explained. Such information is offered for purposes of explanation only and, accordingly, should not be construed in any way to limit the broad scope of the present disclosure and its potential applications.

As described above, multi-stage TIAs may be used in LIDAR systems. FIG. 1 is a schematic diagram of a LIDAR receiver 100. A LIDAR receiver typically includes an optical sensor (for example, an APD) 102, a TIA 104, and an ADC 106. The optical sensor 102 may be configured to receive a pulse of light reflected from an object and to convert the pulse of light to a current pulse. As illustrated in FIG. 1, in some embodiments, the optical sensor 102 may have its cathode connected to the input port of the TIA 104 (the input port of the TIA 104 is illustrated in FIG. 1 with a white dot labeled with IIN (which stands for "input current") 103. Accordingly, the optical sensor 102 may be negatively biased and can sink current from the TIA 104. Although not specifically shown in the present figures, in other embodiments, the optical sensor 102 may have its anode connected to the input port of the TIA 104; accordingly, the optical sensor 102 would then be positively biased and can source current to the TIA 104.

The TIA 104 may be configured to amplify the current pulse from the optical sensor 102 and provide a voltage pulse. The TIA 104 may be a multi-stage TIA having a first stage and a second stage. The first stage may include an amplification circuit 105 (shown in FIG. 1 as, and also interchangeably referred to herein as an "amplifier A0") and a feedback resistor (RT) 107 electrically coupled between an input of the amplification circuit 105 and an output of the amplification circuit 105. The first stage may be configured to convert the single-ended input current signal IIN (e.g., the current from the optical sensor 102) to a single-ended output voltage signal, provided at the output of the amplification circuit 105. The output of the amplification circuit 105 may be electrically connected to an input of the second stage, which may be considered to be a part of an ADC driver. The second stage may include an amplification circuit 109 (shown in FIG. 1 as, and also interchangeably referred to herein as an "amplifier A2"). The second stage may be configured to perform a single-to-differential conversion to generate a differential drive signal for the ADC 106. To that end, the amplification circuit 109 has a differential input, shown in FIG. 1 with two input terminals: a first input terminal, shown as "IN−" (e.g., a negative input), and a second input terminal, shown as "IN+" (e.g., a positive input). FIG. 1 further illustrates that the amplification circuit 109 has a differential output, shown in FIG. 1 with two output terminals: a first output terminal, shown as "OUT−" (e.g., a negative output), and a second output terminal, shown as "OUT+" (e.g., a positive output). The ADC 106 may convert the received differential analog signal (which is based on the differential output from the amplification circuit 109), e.g., the differential analog voltage pulse signal, to a digital signal. The digital signal can be provided to a digital signal processor (not shown in FIG. 1).

Typically, the two amplifiers, A0 and A2 are designed to be optimized in terms of different parameters. The amplifier A0 can be optimized for maximum dynamic range, e.g., maximum input linear range and minimum input current noise, while the amplifier A2 can be optimized as an output stage for maximum output swing, which may also include, or be included in, an ADC driver which may scale the signal and center the differential outputs around the ADC's input common-mode voltage.

As shown in FIG. 1, the negative input terminal of the amplifier A2 (i.e., the input terminal of A2 that is labeled in FIG. 1 with "IN−") may be coupled to the single-ended output of the amplifier A0. The positive input terminal of the amplifier A2 (i.e., the input terminal of A2 that is labeled in FIG. 1 with "IN+") may be coupled to a reference voltage source 110, configured to output a reference voltage VREF. The reference voltage provided by the reference voltage source VREF may be adjustable, e.g., in order to make the best use of the dynamic range offered by the electronic component configured to receive the differential output from the second stage of the TIA 104, e.g., in order to make the best use of the dynamic range offered by the ADC 106.

Figure 2:
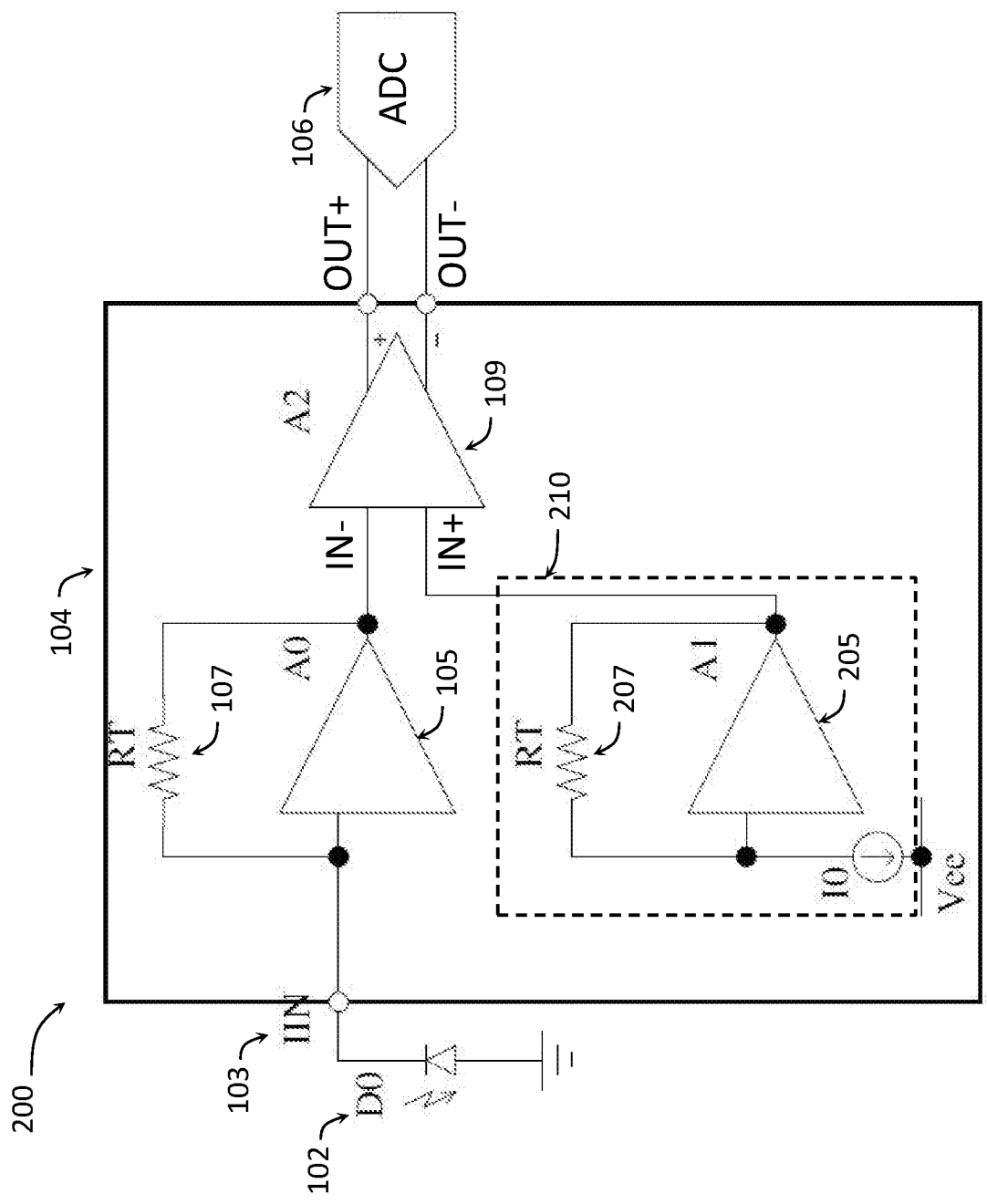
FIG. 2 is an electric circuit diagram showing example implementation of a reference voltage source for a LIDAR receiver.

In some embodiments, the reference voltage source 110 of FIG. 1 may be implemented as shown in FIG. 2 with a reference voltage circuit 210 (otherwise FIG. 2 illustrates a LIDAR receiver 200 that is substantially the same as the LIDAR receiver 100 shown in FIG. 1). FIG. 2 illustrates that, in some embodiments, the circuit 210 may include an amplification circuit 205 (shown in FIG. 2 as, and also interchangeably referred to herein as an "amplifier A1") and a feedback resistor (RT) 207 electrically coupled between an input of the amplification circuit 205 and an output of the amplification circuit 205. The output of the amplification circuit 205 may be electrically coupled to the input of the second stage, e.g., to the positive input terminal of the amplifier A2. In some embodiments, the amplifier A1 may be substantially an exact copy, or a scaled copy (which may save area and power), of the amplifier A0. While the amplifier A0 may be referred to as a "signal TIA" or a "main TIA" (because this is the circuit that performs conversion of current to voltage), the amplifier A1 may be referred to as a "reference TIA" or a "replica TIA." The reference voltage VREF provided by the amplifier A1 at the positive input of the amplifier A2 can be adjusted in a power-efficient manner using a current source that provides current I0 to the input of the replica TIA A1. The replica amplifier A1's output voltage for I0=0, may be configured to track the output voltage of the main amplifier A0 for IIN=0 over process, voltage and temperature (PVT) variations. The current I0 is typically referred to as an "output offset current" of/for the first stage of the TIA 104. The output offset current may be used to modify the output of the multi-stage TIA 104, a process sometimes referred to as "tilting," in order to better utilize the input signal range of the subsequent electronic component configured to receive the output of the TIA 104, e.g., the ADC 106.

State-of-the art solutions typically focus on mitigating overload of the amplifier A0, for example in response to the output current of the optical sensor 102 going beyond the linear input range of the amplifier A0, to prevent permanent damage and to ensure quick recovery times. A TIA optimized for low-noise and large output swing in a high-speed LIDAR receiver may have a linear range of 100 microamps. At very large currents from the optical sensor 102, for example on the order of several hundred milliamps, external mechanisms, such as protection diodes, may be necessary to prevent permanent damage to the amplifier A0. At more moderate currents from the optical sensor 102, for example on the order of milliamps, the amplifier A0 may include internal mechanisms to keep transistors out of saturation region which facilitates a quick recovery after the overload condition is removed.

Inventors of the present disclosure realized that, for best response, each amplifier stage of a multi-stage TIA needs to recover quickly. While existing solutions may have relied on internal mechanisms within each amplifier to deal with overload conditions, embodiments of the present disclosure provide simple adjustable circuits that rely on limiting the maximum swing in the preceding amplifier stage.

Input and Output Waveforms at the Amplifier A2 of a Multi-Stage TIA

Figure 3:
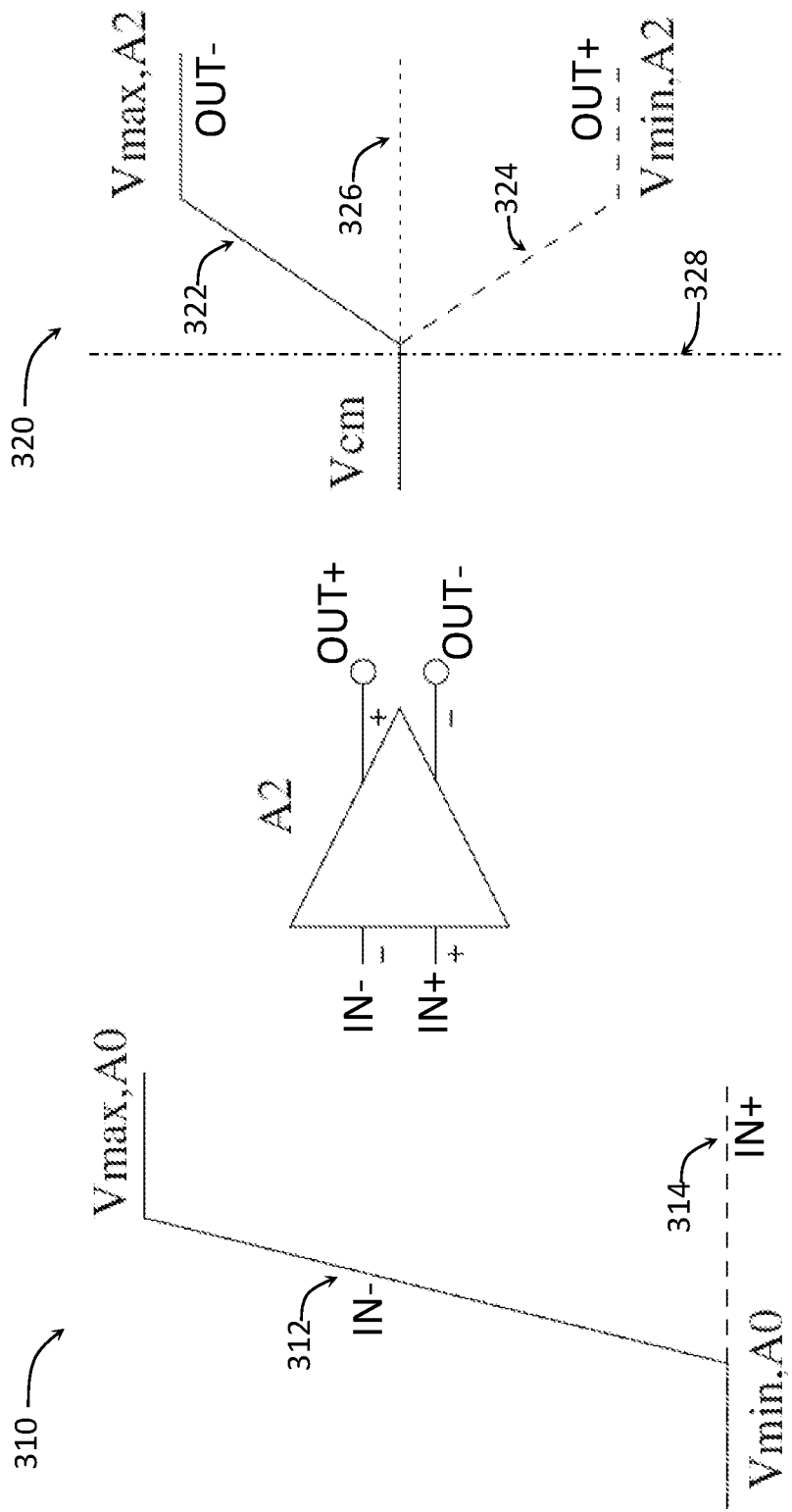
FIG. 3 provides an illustration of an example input waveform for the amplifier A2 and an illustration of an example output waveform for the amplifier A2 for I0 set to zero.

FIG. 3 provides an illustration 310 of an example input waveform for the amplifier A2 and an illustration 320 of an example output waveform for the amplifier A2 for I0=0. A solid line 312 of the illustration 310 is indicative of the signal provided to the negative input IN− of the amplifier A2 when I0=0. A dashed line 314 of the illustration 310 is indicative of the signal provided to the positive input IN+ of the amplifier A2 when I0=0. A solid line 322 of the illustration 320 is indicative of the signal provided at the negative output OUT− of the amplifier A2 when I0=0. A dashed line 324 of the illustration 320 is indicative of the signal provided at the positive output OUT+ of the amplifier A2 when I0=0.

The line 312 of the illustration 310 shows an example response of the output of the amplifier A0 versus the input current to the amplifier A0, IIN. For IIN=0, the output of the amplifier A0 may have a minimum value of $V_{min,A0}$, labeled at the bottom of the illustration 310. The output of the replica amplifier A1 with zero output offset current, i.e., I0=0, is also $V_{min,A0}$. When IIN=0 and I0=0, the amplifiers A0 and A1 may be considered to be matching in all respects and their outputs are the same. As the input current IIN is increased, the output of the amplifier A0 may reach its maximum value of $V_{max,A0}$, also labeled in the illustration 310. Thus, when I0=0, the minimum differential input for the amplifier A2 may be 0, which is the difference between the output from the amplifier A0 when IIN is minimum (i.e., IIN=0), which is $V_{min,A0}$, and the output from the amplifier A1, which is also $V_{min,A0}$ when I0=0 and IIN=0. On the other hand, the maximum differential input for the amplifier A2 may be the difference between $V_{max,A0}$ and $V_{min,A0}$, i.e., the difference between the output from the amplifier A0 when IIN is maximum, which is $V_{max,A0}$, and the output from the amplifier A1 when I0=0, which is $V_{min,A0}$. The illustration 320 of FIG. 3 shows a vertical dash-dotted line 328. The portion of the illustration 320 shown to the left of the line 328 illustrates the negative and positive outputs of the amplifier A2 when IIN=0. The portion of the illustration 320 shown to the right of the line 328 illustrates the negative and positive outputs of the amplifier A2 when IIN is gradually increasing, showing the divergence between the negative and positive outputs of the amplifier A2.

In pulsed LIDAR systems, where the linearity of the output is usually not important, the maximum output swing of the amplifier A0 when referred to the input for the amplifier A0 corresponds to its linear input range for currents ($I_{LR}$, where "LR" stands for "linear range"), i.e.:

$$I_{LR} = \frac{V_{max,A0} - V_{min,A0}}{RT}, \tag{1}$$

where RT is the feedback resistance 107 between the input and output of the amplifier A0. In such a case, as shown with the illustration 320 of FIG. 3, the differential output response of the amplifier A2 may be symmetric outputs around a common-mode voltage, Vcm (shown in the illustration 320 of FIG. 3 with a dotted line 326), with a minimum value of $V_{min,A2}$ at the negative output terminal OUT− of the amplifier A2, and a maximum value of $V_{max,A2}$, at the positive output terminal OUT+ of the amplifier A2. In some embodiments, the common-mode voltage, Vcm, of the amplifier A2 may be set to match the input common-mode voltage of the ADC 106. In various embodiments, the TIA 104 may have additional passive and/or active components, not shown in the present drawings, to set or regulate the outputs to a desired common-mode output voltage to match the input common-mode of the ADC 106.

To maximize the differential output swing of the amplifier A2, the optimal reference voltage, $VREF_{opt}$, at the positive input IN+ of the amplifier A2 may be set to the average of $V_{min,A0}$ and $V_{max,A0}$:

$$VREF_{opt} = \frac{V_{max,A0} - V_{min,A0}}{2}, \tag{2}$$

which will limit the maximum voltage the differential input for the amplifier A2 to:

$$dV = \pm \frac{V_{max,A0} - V_{min,A0}}{2}, \tag{3}$$

i.e., the linear range of the amplifier is +/−dV, which is half of the maximum swing of the amplifier A0.

Figure 4:
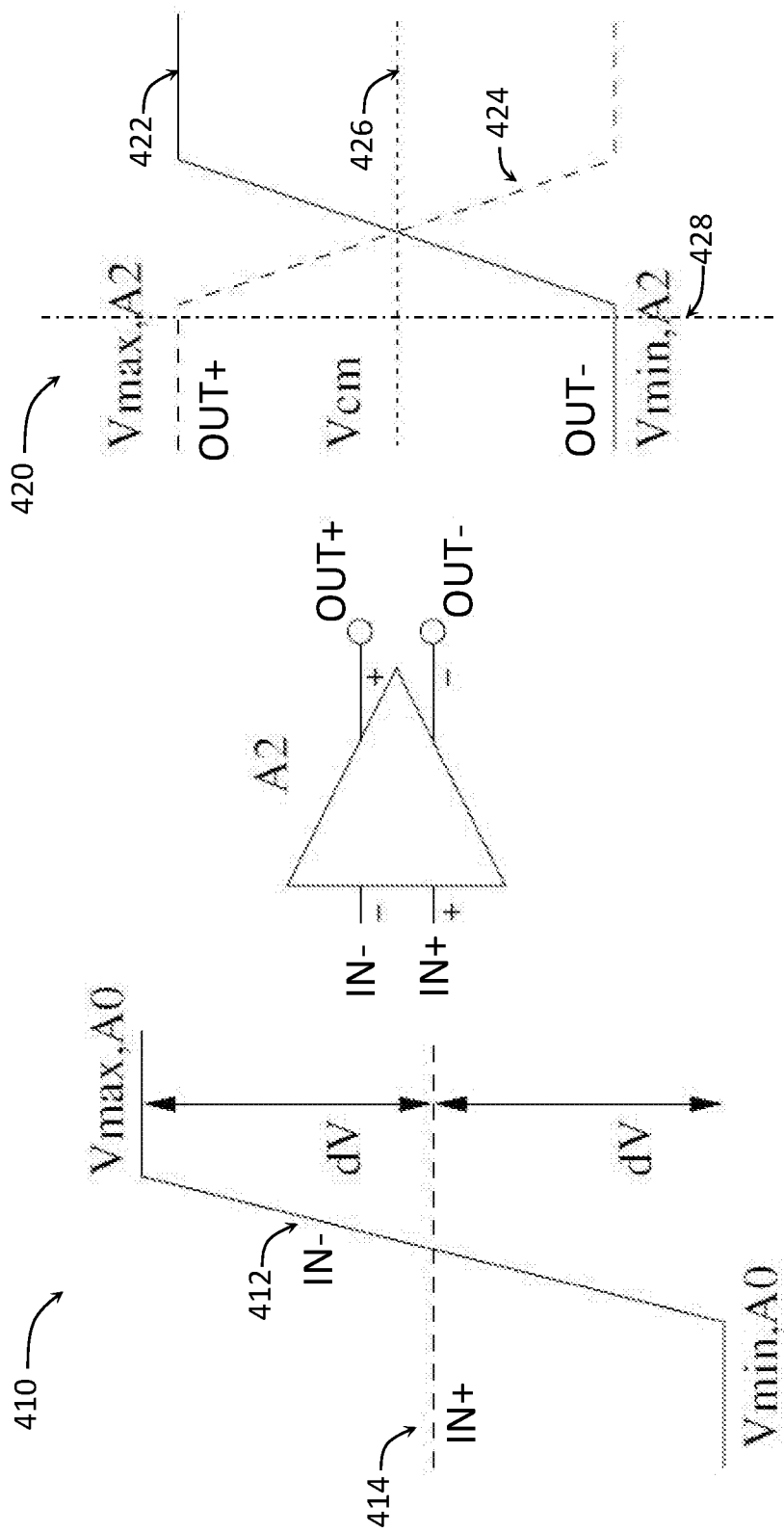
FIG. 4 provides an illustration of an example input waveform for the amplifier A2 and an illustration of an example output waveform for the amplifier A2 for I0 set to $0.5*I_{LR}$.

The optimal output offset current in this case will be $$I0_{opt} = \frac{VREF_{opt}}{RT},$$

which is equal to half of the linear input range $I_{LR}$ for the first stage amplifier A0 (i.e., $I0_{opt}=0.5*6$). FIG. 4 provides an illustration 410 of an example input waveform for the amplifier A2 and an illustration 420 of an example output waveform for the amplifier A2 for the output offset current I0 being equal to half of the linear input range $I_{LR}$ of the amplifier A2 (i.e., $I0=I0_{opt}=0.5*I_{LR}$). A solid line 412 of the illustration 410 is indicative of the signal provided to the negative input in− of the amplifier A2 when $I0=I0_{opt}=0.5*I_{LR}$. A dashed line 414 of the illustration 410 is indicative of the signal provided to the positive input IN+ of the amplifier A2 when $I0=I0_{opt}=0.5*I_{LR}$. A solid line 422 of the illustration 420 is indicative of the signal provided at the negative output OUT− of the amplifier A2 when $I0=I0_{opt}=0.5*I_{LR}$. A dashed line 424 of the illustration 420 is indicative of the signal provided at the positive output OUT+ of the amplifier A2 when $I0=I0_{opt}=0.5*I_{LR}$.

As shown in FIG. 4, with the optimal reference voltage at the positive input IN+ of the amplifier A2, the differential output swing of the amplifier A2 of the illustration 420 in FIG. 4, may be double of the differential output swing of the illustration 320 in FIG. 3. The illustrations of FIGS. 3 and 4 show that, when IIN=0 and the output offset current I0=0, then the amplifiers A0 and A1 match in all respects and their outputs are substantially the same, and that, by changing I0, a differential voltage may be created at the input to A2, which may advantageously realize what is commonly referred to as "tilt"—namely, the separation between the negative and positive outputs of the amplifier A2 when IIN=0, which allows using the full range of the amplifier A2. The illustration 420 of FIG. 4 further shows a line 426, representing the common-mode voltage Vcm, and a vertical dash-dotted line 428. The portion of the illustration 420 shown to the left of the line 428 illustrates the negative and positive outputs of the amplifier A2 when IIN is minimum (e.g., when IIN=0, which is minimum for unipolar input currents at the input of the amplifier A0). The portion of the illustration 320 shown to the right of the line 428 illustrates the negative and positive outputs of the amplifier A2 when IIN is gradually increasing. Both the portion to the left and the portion to the right of the line 428 show the divergence between the negative and positive outputs of the amplifier A2, which is the "tilt" of the amplifier A2 by properly selecting the output offset current I0. This is in contrast to the illustration of FIG. 3 where the output offset current I0 was equal to zero and, therefore, the portion to the left of the line 328 in the illustration 320 of FIG. 3 did not have the divergence between the negative and positive outputs of the amplifier A2 when IIN=0.

A Multi-Stage TIA with Clamping Based on the Output Offset Current

As the foregoing illustrates, the output offset current I0 may be provided to the replica amplifier A1 to generate a voltage at the positive input of the differential amplifier A2 that allows better utilization of the input linear range of the amplifier A2. As described above, the optimal output offset current, $I0_{opt}$, may be equal to half of the linear range of the output of the amplifier A0, i.e., half of the linear range current defined by the equation (1) above, which results in the optimal voltage $VREF_{opt}$ at the positive input of the amplifier A2, the optimal voltage being the average of $V_{min,A0}$ and $V_{max,A0}$, in accordance with the equation (2) above. In various embodiments, the arrangement of the TIA 104 with the amplifiers A0, A1, and A2 as described herein may be used with different ADCs (or different other electronic components that receive the differential output from the amplifier A2 as an input), where different ADCs may have different input ranges and, consequently, the second stage of the multi-stage TIA 104 may have different input ranges. In addition, if an input range of a differential ADC is smaller than that of the input range of the TIA, then the input range of the TIA should be limited so that the output of the TIA does not exceed the ADC's input range. Consequently, the value of the optimal output offset current $I0_{opt}$ may vary depending on the implementation of the multi-stage TIA 104. Therefore, a multi-stage TIA may be configured so that the output offset current I0 may be controlled by an external signal, e.g., by an external voltage signal. Such a voltage signal may be provided as an output from a digital-to-analog converter (DAC), or by any other circuit suitable to generate such a control signal. A voltage-to-current converter may then be used to convert the external voltage signal to the output offset current I0.

Inventors of the present disclosure realized that even having an output offset current controllable with an external signal as described above may not always function as intended to prevent overloading of various components of a multi-stage TIA such as the multi-stage TIA 104. In particular, inventors of the present disclosure realized that, even though it is possible to try to generate the output offset current equal to the optimal $I0_{opt}$ using an external control signal, the actual output offset current, $I0_{act}$, received by the replica amplifier A1 may deviate from the optimal, $I0_{opt}$. Some reasons why the value of an actual output offset current may deviate from the optimal value include PVT variations and the fact that external control signals and the voltage-to-current converter circuits that may be used to generate the output offset current based on control voltages may be subject to variation. Having the actual output offset current $I0_{act}$ deviate from the optimal output offset current $I0_{opt}$ may cause problems such as overloading of the amplifier A2. For example, if the actual output offset current $I0_{act}$ is less than $I0_{opt}$, then the maximum differential input for the amplifier A2 may exceed dV and overload the amplifier A2. Similarly, having the voltage at the positive input of the amplifier A2 falling below a certain minimum value based the actual output offset current deviates from the optimal current $I0_{opt}$ may cause problems.

Embodiments of the present disclosure are based on recognition that deviation of the actual output offset current $I0_{act}$ from the optimal output offset current $I0_{opt}$ may be compensated by providing a clamp circuit, coupled to the negative input of the amplifier A2, and configured to clamp the maximum or the minimum voltage at the negative input of the amplifier A2 based on the actual output offset current $I0_{act}$ that defines the voltage at the positive input of the amplifier A2. In this manner, the actual output offset current $I0_{act}$ may happen to deviate from the optimal output offset current $I0_{opt}$, resulting in the deviation of the actual voltage at the positive input of the amplifier A2 from the optimal value $VREF_{opt}$, but the clamp circuit configured to correspondingly clamp the voltage at the negative input of the amplifier A2 to a value that is based on the actual output offset current $I0_{act}$ may compensate for said deviations at the positive input to ensure, e.g., that the amplifier A2 is not overloaded.

Figure 5:
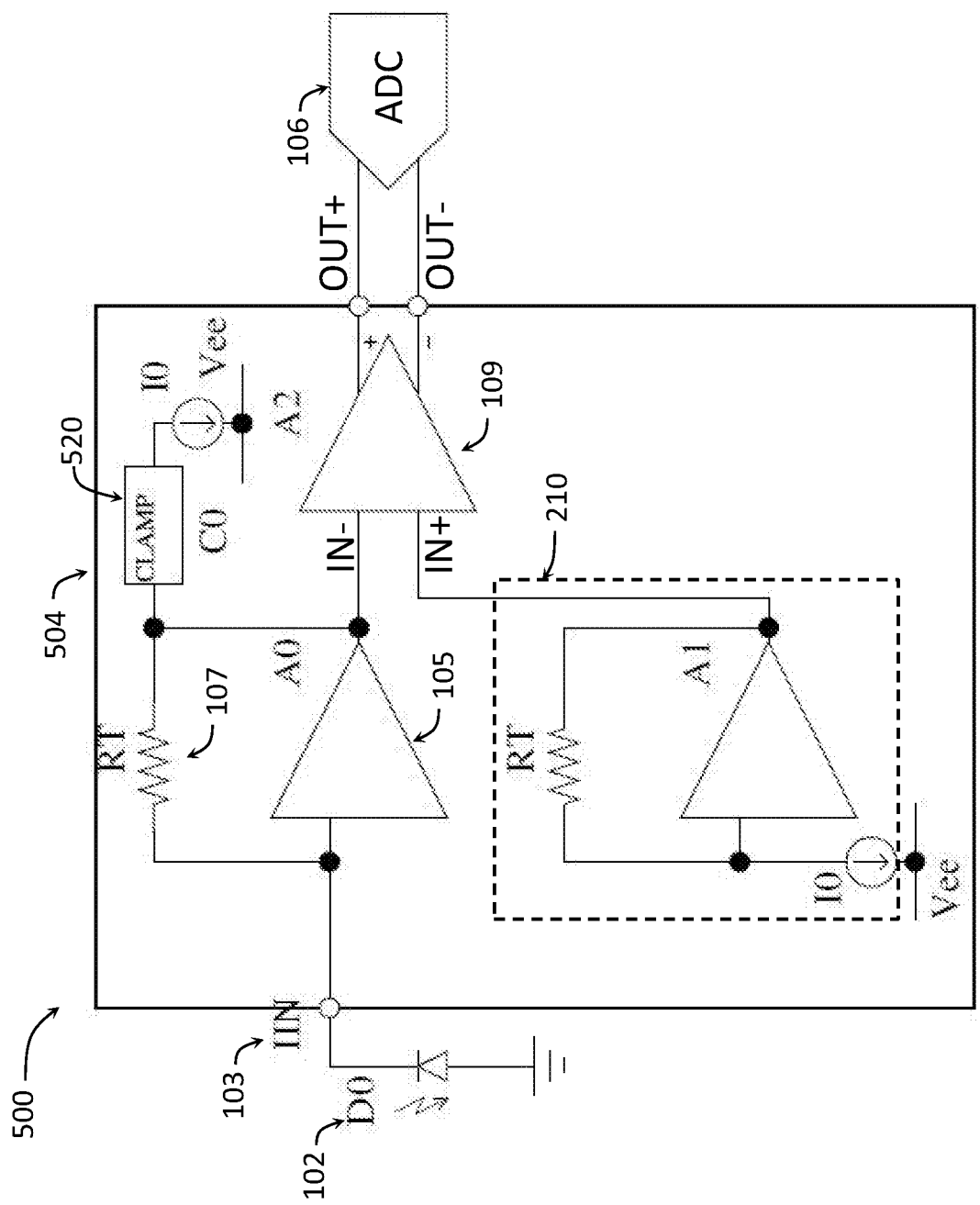
FIG. 5 is an electric circuit diagram showing a LIDAR receiver with a multi-stage TIA with an adjustable input range, according to some embodiments of the present disclosure.

FIG. 5 is an electric circuit diagram showing a LIDAR receiver 500 with a multi-stage TIA 504 with an adjustable input range, according to some embodiments of the present disclosure. As shown in FIG. 5, the LIDAR receiver 500 may include the optical sensor 102 and the ADC 106, as described above. In addition, the TIA 504 may include a first stage having the amplifier A0 and the resistor RT, as described above, the amplifier A0 configured to receive the input current signal IIN, and may further include a second stage having the amplifier A2, as also described above. Furthermore, the TIA 504 may further include a circuit such as the replica amplifier A1 configured to use the output offset current I0 to set the voltage at the positive input of the amplifier A2, also as described above. Thus, the TIA 504 may be substantially similar to the TIA 104 shown in FIG. 2. What is different in the TIA 504 is that it further includes a clamp circuit 520, coupled to the output of the amplifier A0 (or, equivalently, coupled to one of the differential inputs of the amplifier A2, namely to the negative input of the amplifier A2) and configured clamp the voltage of the signal at the output of the amplifier A0 (or, equivalently, of the signal at the negative input of the amplifier A2) to a clamp value, where the clamp value is based on the output offset current I0 provided to the replica amplifier A1.

First consider the scenario that the clamp circuit 520 is a high-side clamp.

To avoid overloading the amplifier A2, the maximum voltage at the output of the amplifier A0 may need to be limited to less than $V_{max,A0}$. To that end, the clamp circuit 520 (C0), shown in FIG. 5, may be a high-side clamp 520, coupled to the output of the amplifier A0. The clamp C0 may be directly or indirectly coupled to the output of the amplifier A0 with the purpose of limiting the maximum output voltage of the amplifier A0. In particular, the clamp C0 may be programmable by the same value of output offset current I0 as the one used by the replica amplifier A1 to generate the reference voltage at the positive input of the amplifier A2, so that the output voltage of the amplifier A0 may be clamped to a maximum value $V_{CLHI}$ that is defined based on the output offset current I0. For example, the maximum output voltage of the amplifier A0 may be clamped to not exceed the output voltage of the amplifier A1 by the linear input range dV of the amplifier A2, i.e.:

$$V_{CLHI} = V_{out,A1} + dV, \quad (4)$$

where the abbreviation "CLHI" in the term $V_{CLHI}$ indicates that the voltage $V_{CLHI}$ is a high (HI) clamp (CL) voltage. The equation (4) may be re-written as:

$$V_{CLHI} = (I0 * RT + V_{min,A0}) + \frac{V_{max,A0} - V_{min,A0}}{2}. \quad (5)$$

It should be noted that the TIA 504 shown in FIG. 5 illustrates a current source that generates the output offset current I0 two times—one as providing an input to the amplifier A1 and one as providing an input to the clamp 520. In some embodiments, this may imply that the same current source is used in these two instances to generate the output offset current I0 (i.e., a single current source is used to provide the output offset current I0 as an input to the amplifier A1 and as an input to the clamp 520). For example, in some such embodiments, a single current mirror with multiple outputs may be used to generate the currents with the same value. In other embodiments, current sources that generate the current I0 as an input to the amplifier A1 and as an input to the clamp 520 may be different current sources, both set to the same value, e.g., both programmed using an external voltage, as described above. In some embodiments of FIG. 5, the amplifier A1 may be a scaled (e.g., smaller) version of the amplifier A0 (e.g., to save silicon area and/or quiescent current drawn from the power supply). For example, scaling may be implemented by using a feedback resistor with a resistance of N*RT, where the scaling factor N may be a number greater than 1 (while FIG. 5 illustrates the feedback resistor of the amplifier A1 with N=1). In such embodiments, the current source at the input of amplifier A1 will be scaled down by the same factor to I0/N.

When referred to the input, clamping the maximum voltage at the output of the amplifier A0 to the clamp voltage $V_{CLHI}$ using such a clamp circuit 520 corresponds to (or results in) effectively adjusting a linear input range for the amplifier A0, i.e., the first stage of the TIA 504 (hence, the TIA 504 may be referred to as a multi-stage TIA "with an adjustable input range") based on the output offset current. In particular, the equation (1) may now be re-written to replace $V_{max,A0}$ with $V_{CLHI}$ as follows:

$$I_{LR} = \frac{V_{CLHI} - V_{min,A0}}{RT}. \quad (6)$$

Replacing the $V_{CLHI}$ in the equation (6) with the right side of the equation (5), dependence of the input linear range $I_{LR}$ on the output offset current I0 becomes clear:

$$I_{LR} = I0 + \frac{V_{max,A0} - V_{min,A0}}{2 * RT}. \quad (7)$$

The proposed high-side clamp 520 may not only reduce or eliminate the chances of the amplifier A2 overloading, but may also adjust the input linear range of the amplifier A0 to maintain a linear transfer function between the single ended input IIN and differential outputs OUT+ and OUT− of the amplifier A2. The equation (7) shows that the input linear range is now a function of output offset current I0 with a maximum value of $(V_{max,A0} \pm V_{min,A0})/RT = VREF_{opt}/RT$. The maximum input linear range is the input linear range before the introduction of the high-side clamp.

Figure 6:
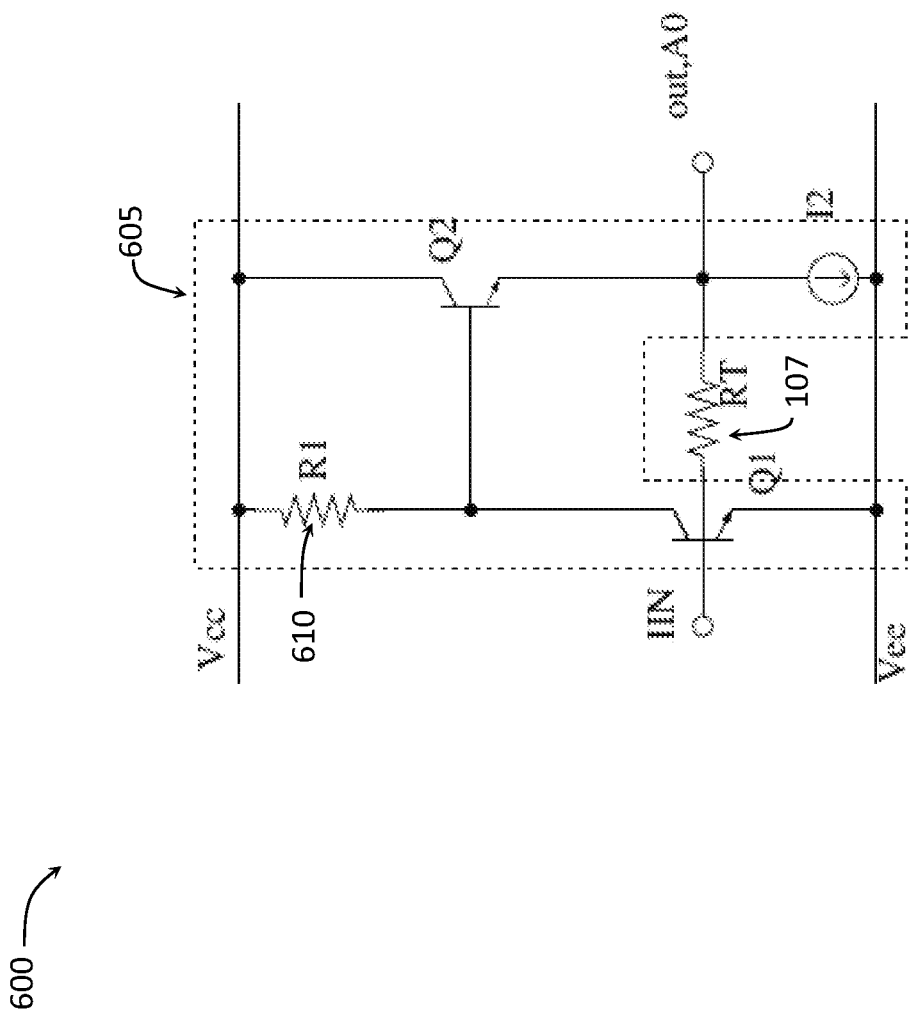
FIG. 6 is an electric circuit diagram showing an example single-ended TIA that may be used within the multi-stage TIA of FIG. 5, according to some embodiments of the present disclosure.

FIG. 6 is an electric circuit diagram showing a first stage 600 of an example TIA, according to some embodiments of the present disclosure. The first stage 600 may be used to implement the first stage of the TIA 504, shown in FIG. 5, i.e., to implement the amplifier A0 with the resistor RT as shown in FIG. 5. In particular, an example for a wide bandwidth high dynamic range amplifier 105 (A0) of FIG. 5 is shown as a circuit 605 in FIG. 6 (enclosed within a dotted contour). As shown in FIG. 6, the amplifier 605 may include transistors Q1 and Q2 (both shown as NPN transistors), a load element 610 (e.g., a load resistor) R1, and current source I2. FIG. 6 further shows the feedback resistor 107 (RT) connected between the input terminal to the amplifier A0, IIN, and the output terminal of the amplifier A0, labeled in FIG. 6 as out,A0. FIG. 6 also illustrates Vee (i.e., the negative supply for the circuit, which may be ground voltage), and Vcc (i.e., the positive supply for the circuit).

Figure 7B:
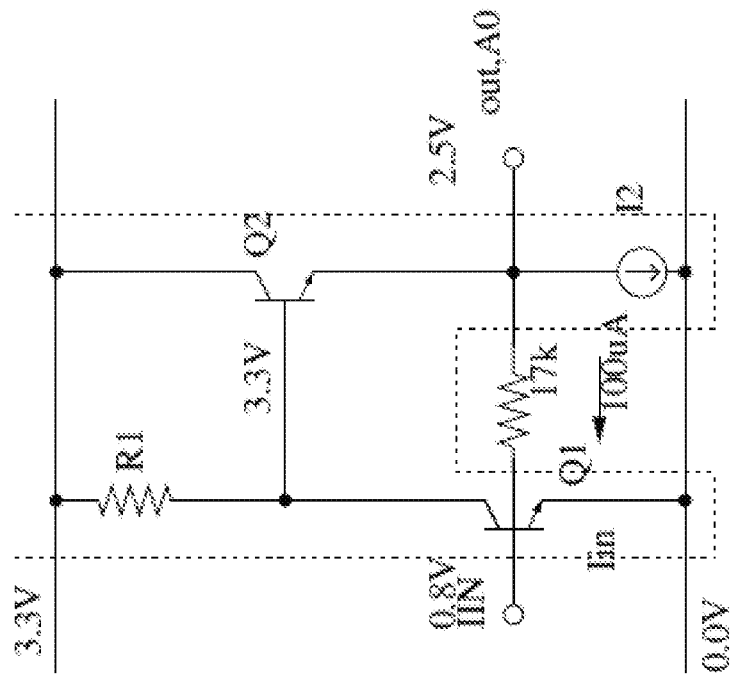
FIGS. 7A and 7B are electric circuit diagrams of FIG. 6, showing operating point examples for minimum and maximum output swings, respectively.
Figure 7A:
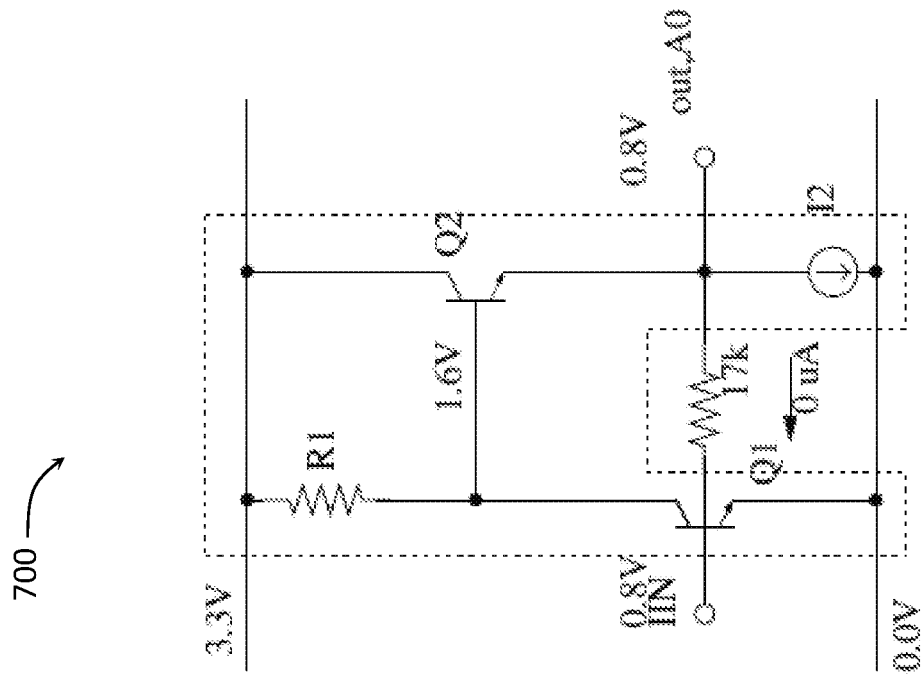

FIGS. 7A and 7B are electric circuit diagrams of FIG. 6, showing operating point examples for minimum and maximum output swings, respectively.

FIG. 7A shows default operating point for no input current under the following conditions: positive supply Vcc=3.3V, negative supply Vee=0.0V, and zero input current. Furthermore, base-emitter voltage ($V_{BE}$) of 0.8V is assumed for each of the transistors shown in FIG. 7A, and base currents are assumed to be negligible. The input terminal IIN at the base of Q1 is at Vee+$V_{BE}$=0.8V and so is the output terminal out, A0. Therefore, the minimum voltage output swing may be $V_{min,A0}$=0.8V.

FIG. 7B demonstrates the maximum output swing. As $I_{C,Q1}$ (i.e., the collector current of Q1) goes towards zero, the base voltage of Q2 will go towards positive supply of 3.3V, and therefore maximum output voltage on output terminal out,A0 will be 0.8V below the positive supply, i.e., $V_{max,A0}$=2.5 V ($V_{max,A0}$=Vcc−$V_{BE}$=2.5V). At the maximum output swing, for feedback resistor RT=17 kiloohms, the input current, which is also equal to the input linear range under this condition, will be 100 microamps. Applying an output offset current of 50 microamps at the input amplifier A1 will generate the optimal reference voltage $VREF_{opt}$=1.65V, according to equation (2) above.

Figure 8:
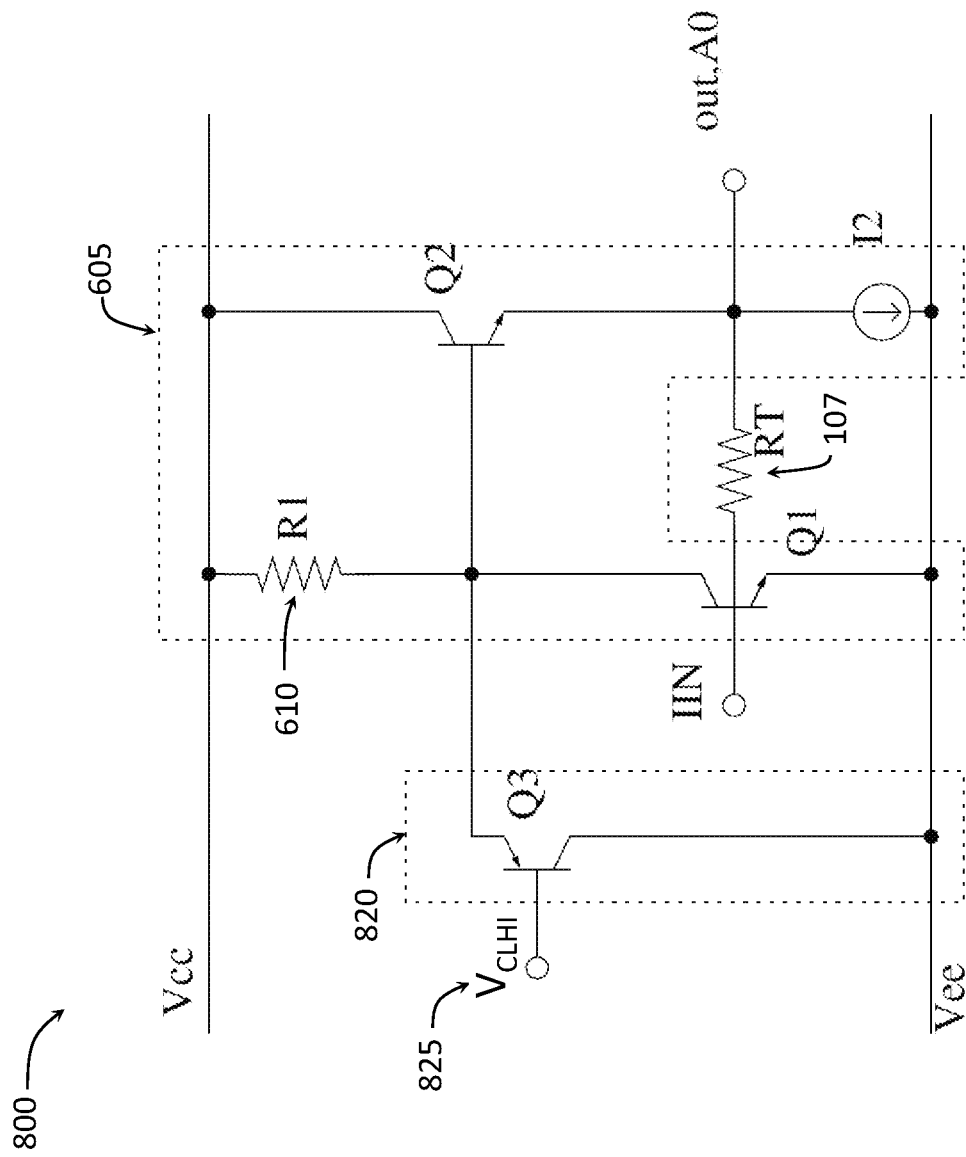
FIG. 8 is an electric circuit diagram showing an example of a first stage of a multi-stage TIA with an adjustable input range realized by a voltage-controlled high-side clamp circuit, according to some embodiments of the present disclosure.

FIG. 8 is an electric circuit diagram showing an example of a first stage 800 of the multi-stage TIA 504 with an adjustable input range realized by the clamp circuit 520 being a voltage-controlled high-side clamp circuit, according to some embodiments of the present disclosure. FIG. 8 provides an illustration similar to the first stage 600 shown in FIG. 6, further showing a transistor Q3 being used to implement the clamp circuit 520 as a high-side clamp circuit 820 (the approximate outline of the clamp circuit shown in FIG. 8 with a dotted contour labeled with the reference numeral 820). As is shown in FIG. 8, the transistor Q3 may be controlled by a control voltage 825 (e.g., by having its base terminal being coupled to the control voltage 825), which may be set to $V_{CLHI}$ as described above, i.e., where the control voltage 825 is a function of the output offset current I0. The transistor Q3 is indirectly coupled to the output of the amplifier A0 (out,A0) by being coupled to the transistor Q2 as shown in FIG. 8, and may, therefore, limit the maximum output swing of the amplifier A0. As shown in FIG. 8, in some embodiments, the transistor Q3 may be implemented as a PNP transistor where the base of the transistor Q3 may be coupled to the control voltage (high clamp voltage) $V_{CLHI}$, the collector of the transistor Q3 may be coupled to the negative supply Vee, and the emitter of the transistor Q3 may be coupled to the load transistor R1 and to the base of the transistor Q2 of the amplifier A0 implemented as the circuit 605, described above. In this arrangement, if the output offset current is set to zero, and further assuming that $V_{BE,Q2}=|V_{BE,Q3}|$, setting $V_{CLHI}$ to be equal to 1.65V (according to equation (5) above) will restrict input linear range to 50 microamps (according to equation (7) above).

Figure 9:
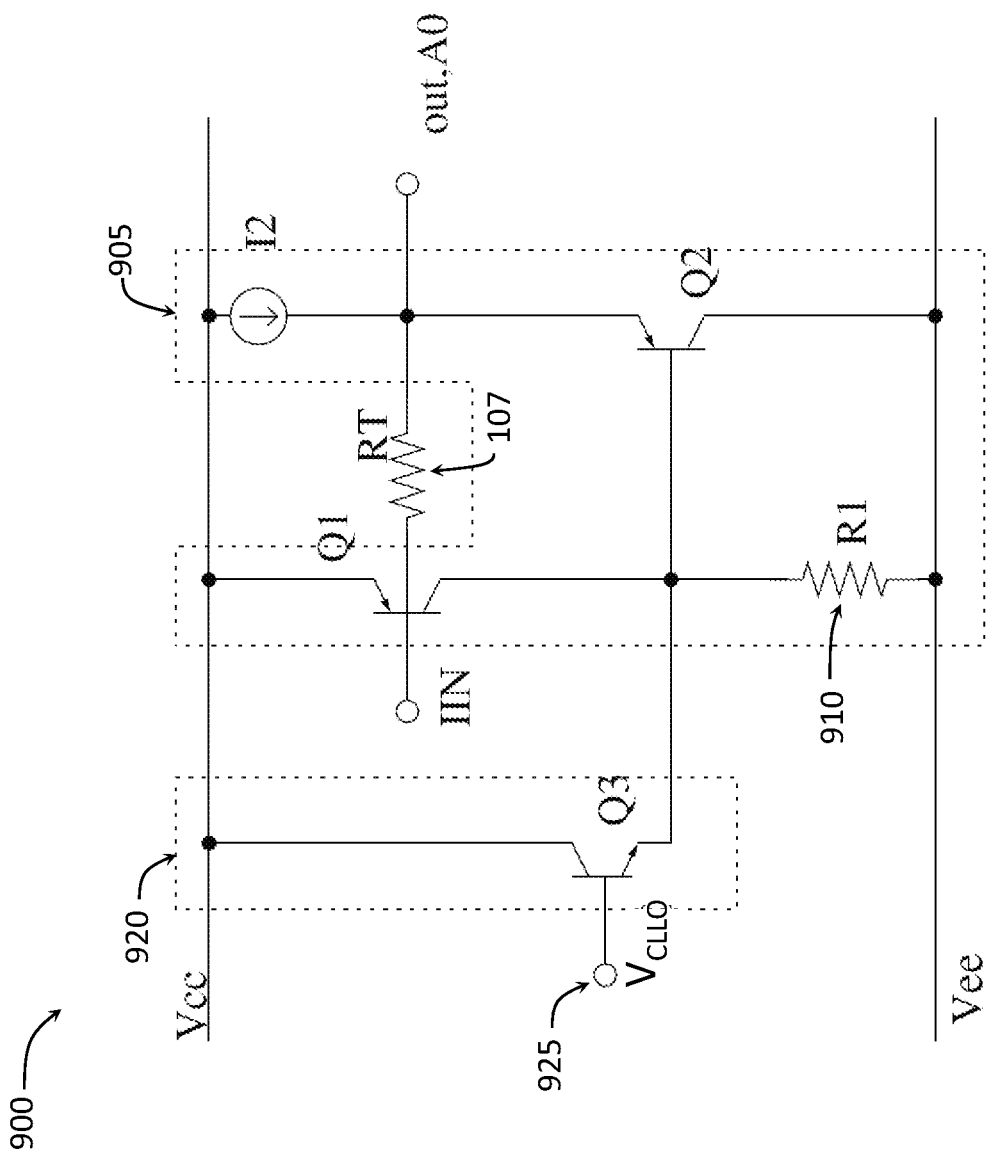
FIG. 9 is an electric circuit diagram showing an example of a first stage of a multi-stage TIA with an adjustable input range realized by a voltage-controlled low-side clamp circuit, according to some embodiments of the present disclosure.

In other embodiments, the clamp circuit 520 may be implemented as a voltage-controlled low-side clamp. An example of such an implementation is shown in FIG. 9, providing an electric circuit diagram showing an example of a first stage 900 of a multi-stage TIA with an adjustable input range realized by a voltage-controlled low-side clamp circuit 920, according to some embodiments of the present disclosure. The electric circuit diagram shown in FIG. 9 is analogous to that shown in FIG. 8 except that all PNP transistors have been replaced with NPN transistors and vice versa, the supply voltages Vcc and Vee have been swapped, and the reference numerals given to various elements start with "9" instead of starting with "8," "6", or "1". In the first stage 900, the abbreviation "CLLO" in the term $V_{CLLO}$ indicates that the control signal 925 is a low (LO) clamp (CL) voltage $V_{CLLO}$. Similar to the high-clamp voltage $V_{CLHI}$ described above, the low-clamp voltage $V_{CLLO}$ is the voltage imposed by the clamp circuit 520 on the output of the amplifier A0 to ensure that said output does not fall below a certain minimum value, the minimum value being $V_{CLLO}$. Also similar to the high-clamp voltage $V_{CLHI}$ described above, the low-clamp voltage $V_{CLLO}$ depends on the actual output offset current I0. In particular, the clamp may be programmable by the same value of output offset current I0 as the one used by the replica amplifier A1 to generate the reference voltage at the positive input of the amplifier A2, so that the output voltage of the amplifier A0 may be clamped to a minimum value $V_{CLLO}$ that is defined based on the output offset current I0. For example, the minimum output voltage of the amplifier A1 may be clamped to not fall below the output voltage of the amplifier A1 by the linear input range dV of the amplifier A2, i.e.:

$$V_{CLLO} = V_{out,A1} - dV. \quad (8)$$

The equation (8) may be re-written as:

$$V_{CLLO} = (V_{max,A0} - I0*RT) - \frac{V_{max,A0} - V_{min,A0}}{2}. \quad (9)$$

One may notice the symmetry between the high-side equations (4), (5) and low-side clamp equations (8), (9): supplies and direction of current have been flipped, therefore +dV in the equation (4) becomes −dV in the equation (8), +I0*RT in the equation (5) becomes −I0*RT in the equation (9), and $V_{min,A0}=Vee+V_{BE}$ in the equation (5) becomes $V_{max,A0}=(Vcc-|V_{BE}|)$ in the equation (9).

When referred to the input, clamping the minimum voltage at the output of the amplifier A0 to the clamp voltage $V_{CLLO}$ using the clamp circuit 520 being a low-side clamp corresponds to (or results in) adjusting a linear input range for the second stage of the TIA 504 according to the equation (9).

Embodiments shown in FIGS. 8 and 9 illustrate voltage-controlled clamp circuits configured to clamp the voltage at the negative input of the amplifier A2 to ensure that, respectively, the voltage at the negative input of the amplifier A2 does not exceed the maximum value set by $V_{CLHI}$ that is dependent on the output offset current (for the embodiment shown in FIG. 8) and the voltage at the negative input of the amplifier A2 does not fall below the minimum value set by $V_{CLLO}$ that is dependent on the output offset current (for the embodiment shown in FIG. 9). However, in other embodiments, voltage-controlled clamp circuits may be implemented other than the circuit 820 or 920, shown in FIGS. 8 and 9, and/or the first stage of the TIA 504 may be implemented using circuits other than the circuit 805 or 905, shown in FIGS. 8 and 9, as long as such other circuits allow realizing $V_{CLHI}$ and $V_{CLLO}$ as described herein. Furthermore, in still other embodiments, the clamp circuit 520 may be implemented as a current-controlled clamp circuit, i.e., where, instead of the voltages $V_{CLHI}$ or $V_{CLLO}$, the control signal that depends on the output offset current is a high-side current $I_{CLHI}$ or a low-side current $I_{CLLO}$.

Figure 10:
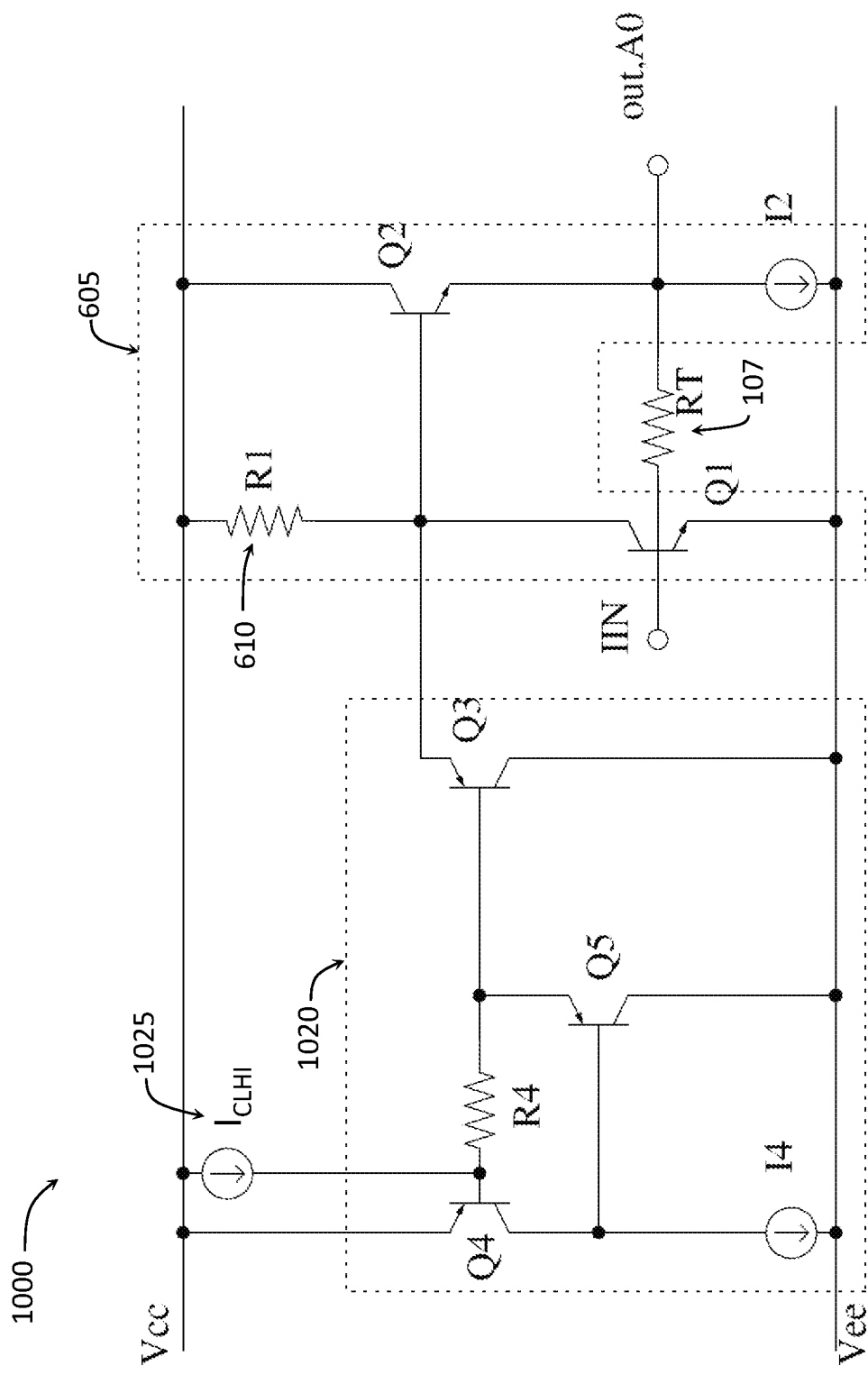
FIG. 10 is an electric circuit diagram showing an example of a first stage of a multi-stage TIA with an adjustable input range realized by a current-controlled high-side clamp circuit, according to some embodiments of the present disclosure.

FIG. 10 is an electric circuit diagram showing an example of a first stage 1000 of the multi-stage TIA 504 with an adjustable input range realized by the clamp circuit 520 being a current-controlled high-side clamp circuit, according to some embodiments of the present disclosure. FIG. 10 provides an illustration similar to the first stage 800 shown in FIG. 8, except that the high-clamp voltage-controlled circuit 820 shown in FIG. 8 is now replaced with a high-clamp current-controlled circuit 1020 in FIG. 10, the circuit 1020 (the approximate outline of the clamp circuit shown in FIG. 10 with a dotted contour labeled with the reference numeral 1020). As shown in FIG. 10, the clamp circuit 1020 may include a transistor Q3, coupled to the first stage of the amplifier as was described with reference to FIG. 8. In contrast to the illustration of FIG. 8, the base terminal of the transistor Q3 of the clamp circuit 1020 is coupled to a further arrangement that may, e.g., include transistors Q3 and Q4 and a resistor R4 as shown in FIG. 10. The further arrangement may couple the base terminal of the transistor Q3 of the clamp circuit 1020 to a control current 1025, which may be set to $I_{CLHI}$ that is a function of the output offset current I0, e.g., as:

$$I_{CLHI} = \frac{Vcc - V_{BE} - (I0*RT + V_{min,A0} + \frac{V_{max,A0} - V_{min,A0}}{2})}{R4}, \quad (10)$$

which may be re-written as:

$$I_{CLHI} = \frac{Vcc - V_{BE} - V_{CLHI}}{R4}. \quad (11)$$

In some embodiments, R4 may be set to RT. The voltage $V_{BE}$ in these equations is a base-emitter voltage across the transistor Q2.

Because the transistor Q3 of the clamp circuit 1020 is indirectly coupled to the output of the amplifier A0 (out,A0) by being coupled to the transistor Q2 as shown in FIG. 10, the transistor Q3 of the clamp circuit 1020 coupled to the control current $I_{CLHI}$ of the clamp circuit 520 may limit the maximum output swing of the amplifier A0 (by limiting the output voltage of the amplifier A0 to $V_{CLHI}$).

Figure 11:
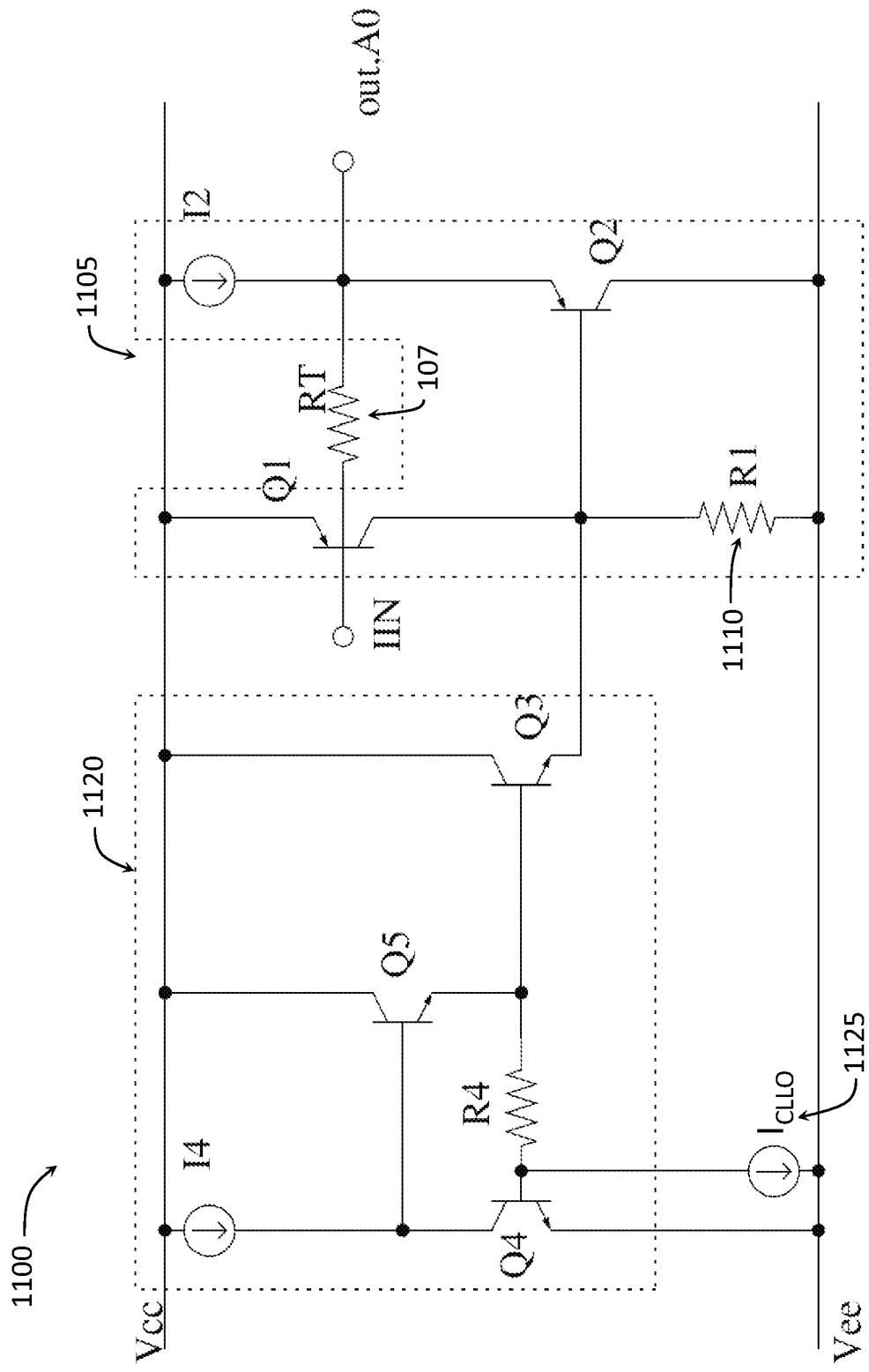
FIG. 11 is an electric circuit diagram showing an example of a first stage of a multi-stage TIA with an adjustable input range realized by a current-controlled low-side clamp circuit, according to some embodiments of the present disclosure.

In other embodiments, the clamp circuit 520 may be implemented as a current-controlled low-side clamp. An example of such an implementation is shown in FIG. 11, providing an electric circuit diagram showing an example of a first stage 1100 of the multi-stage TIA 504 with an adjustable input range realized by the clamp circuit 520 being a current-controlled low-side clamp circuit, according to some embodiments of the present disclosure. The electric circuit diagram shown in FIG. 11 is analogous to that shown in FIG. 10 except that all PNP transistors have been replaced with NPN transistors and vice versa, the supply voltages Vcc and Vee have been swapped, and the reference numerals given to various elements start with "11" instead of starting with "10". In the first stage 1100, the abbreviation "CLLO" in the term $I_{CLLO}$ indicates that the control signal 1125 is a low (LO) clamp (CL) current $I_{CLLO}$. Similar to the high-clamp current $I_{CLHI}$ described above, the low-clamp current $I_{CLLO}$ allows the clamp circuit 520 to impose the voltage $V_{CLLO}$ on the output of the amplifier A0 to ensure that said output does not fall below a certain minimum voltage value, the minimum value being $V_{CLLO}$. Also similar to the high-clamp current $I_{CLHI}$ described above, the low-clamp current $I_{CLLO}$ depends on the actual output offset current I0, e.g., as:

$$I_{CLLO} = \frac{(V_{max,A0} - I0 * RT) - \frac{V_{max,A0} - V_{min,A0}}{2} - V_{BE}}{R4}, \quad (12)$$

which may be re-written as:

$$I_{CLLO} = \frac{V_{CLLO} - V_{BE}}{R4}, \quad (13)$$

assuming that Vee=0. In some embodiments, R4 may be set to RT. The voltage $V_{BE}$ in these equations is a base-emitter voltage across the transistor Q2 (which is negative for a PNP transistor).

When referred to the input, clamping the minimum voltage at the output of the amplifier A0 based on the clamp current $I_{CLLO}$ using the clamp circuit 520 being a low-side clamp corresponds to (or results in) adjusting a linear input range for the second stage of the TIA 504 according to the equation (12).

Embodiments shown in FIGS. 10 and 11 illustrate current-controlled clamp circuits configured to clamp the voltage at the negative input of the amplifier A2 to ensure that, respectively, the voltage at the negative input of the amplifier A2 does not exceed the maximum value set by $I_{CLHI}$ that is dependent on the output offset current (for the embodiment shown in FIG. 10) and the voltage at the negative input of the amplifier A2 does not fall below the minimum value set by $I_{CLLO}$ that is dependent on the output offset current (for the embodiment shown in FIG. 11). However, in other embodiments, current-controlled clamp circuits may be implemented other than the circuit 1020 or 1120, shown in FIGS. 10 and 11, and/or the first stage of the TIA 504 may be implemented using circuits other than the circuit 1005 or 1105, shown in FIGS. 10 and 11, as long as such other circuits allow realizing $V_{CLHI}$ and $V_{CLLO}$ as described herein.

FIGS. 5-11 illustrate some specific example implementations of a multi-stage TIA with a programmable clamp of the first stage according to some embodiments of the present disclosure. Some variations to these arrangements according to other embodiments of the present disclosure have been described above. Still other variations/embodiments are possible and are within the scope of the present disclosure, namely, various other programmable clamps (either high-side or low-side and either voltage-controlled or current-controlled clamps), as long as clamping is dependent on the output offset current I0 as described herein. Some of these further variations/embodiments are described below.

In some embodiments, the multi-stage TIA with clamps programmable using the output offset current as described herein may have additional passive and/or active components to set or regulate the a desired common-mode output voltage, for example to match the input common-mode of an ADC or any other electronic component configured to receive the differential input from the multi-stage TIA.

Furthermore, while illustrations of FIGS. 6-11 are provided for circuits that employ bipolar transistors, these descriptions may be easily adapted to circuits that employ FETs, or a combination of bipolar transistors and FETs. For example, any NPN transistors shown in FIGS. 6-11 may be replaced with NMOS transistors, and/or any PNP transistors shown in FIGS. 6-11 may be replaced with PMOS transistors in further embodiments of multi-stage TIAs 504 with adjustable input range as described herein. In such embodiments, references to base terminals of the bipolar transistors described above may be replaced with "gate terminals" for transistors implemented as FETs, references to emitter terminals of the bipolar transistors described above may be replaced with "source terminals" for transistors implemented as FETs, and references to collector terminals of the bipolar transistors described above may be replaced with "drain terminals" for transistors implemented as FETs. Also, as known in the art, the positive supply Vcc for a bipolar transistor would be a positive supply VDD for a FET and the negative supply Vee for a bipolar transistor would be a negative supply VSS for a FET.

Example Systems

Figure 12:
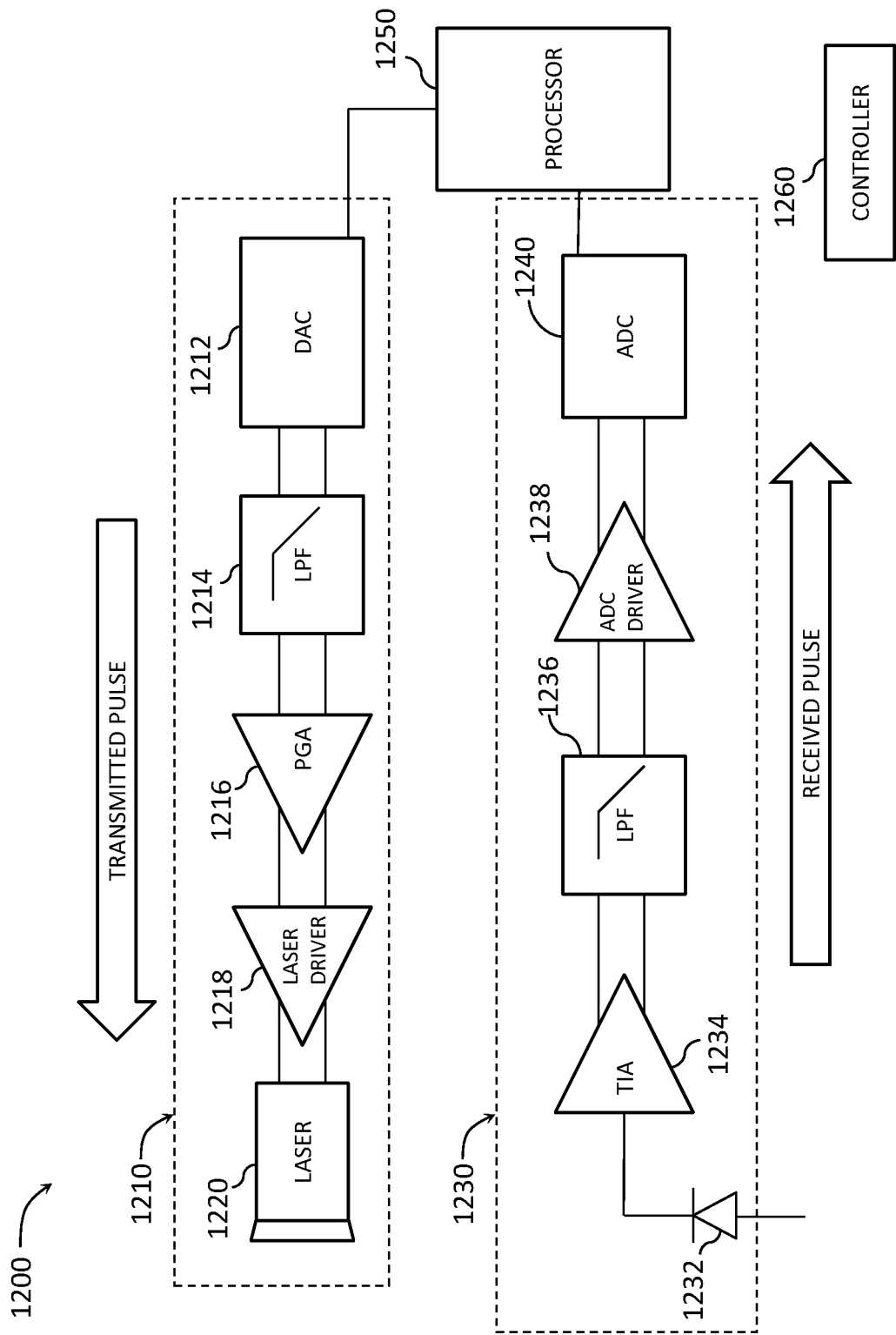
FIG. 12 is a block diagram of an example LIDAR system in which a multi-stage TIA with an adjustable input range may be implemented, according to some embodiments of the present disclosure.

Multi-stage TIAs with adjustable input range as described herein may be used in any kind of system. One example of such a system is shown in FIG. 12, providing a block diagram of an example laser range finding, e.g., LIDAR, system 1200 according to some embodiments of the present disclosure. As shown in FIG. 12, system 1200 may include a transmitter signal chain 1210, a receiver signal chain 1230, a processor 1250, and a controller 1260. In some instances, the receiver signal chain 1230 can be implemented separately from the transmitter signal chain 1210. As shown in FIG. 12, the transmitter signal chain 1210 may include a digital-to-analog converter (DAC) 1212, a low pass filter (LPF) 1214, a programmable gain amplifier (PGA) 1216, a laser driver 1218, and a laser 1220. The receiver chain 1230 may include an optical sensor, e.g., a photodiode (PD) 1232, a transimpedance amplifier (TIA) 1234, an LPF 1236, an analog-to-digital converter (ADC) driver 1238, and an ADC 1240. In some instances, a receiver chain can include a PGA coupled between the TIA 1234 and the LPF 1236. Such a PGA could be implemented in place of or in addition to the ADC driver 1238.

The processor 1250 may be configured to generate a digital signal indicating that a laser pulse is to be emitted by the laser 1220. The digital signal from the processor 1250 may then be converted to an analog signal by the DAC 1212, further processed by the optional LPF 1214, amplified by the PGA 1216, and provided to the laser driver 1218. In some embodiments, the laser 1220 may be a laser diode, e.g., an inductive resonant laser diode.

The light emitted by the laser 1220 can reach an object or a target and reflected light can be received by the optical sensor 1232 of the receiver signal chain 1230. Thus, the reflected light can be detected at the optical sensor 1232. The optical sensor 1232 can be an avalanche photodiode (APD), for example. The optical sensor 1232 can generate a current pulse indicative of the received reflected light and the current pulse may be converted to a voltage pulse by the TIA 1234 and, optionally, further processed by the LPF 1236.

The LPF 1236 can be a tunable filter in certain embodiments. As illustrated, the LPF 1236 may be coupled in a signal path between the TIA 1234 and the ADC driver 1238. In some other implementations, the LPF 1236 can be coupled in a signal path between the ADC driver 1238 and the ADC 1240. The ADC driver 1238 can generate a drive signal, based on the output of the TIA 1234, to drive the ADC 1240. The ADC 1240 can convert the received drive signal to a digital signal, to further be processed by the processor 1250. The TIA 1234 and/or the ADC 1238 may include any embodiment of the multi-stage TIAs with programmable clamps as described herein, e.g., any embodiment of the multi-stage TIAs with programmable clamps described with reference to FIGS. 5-11.

In some embodiments, the processor 1250 can be a hardware processor. In some embodiments, the processor 1250 can be a baseband digital signal processor. In some embodiments, the processor 1250 can determine a distance between an object and the laser range finding system 1200. In some embodiments, the processor 1250 can output a signal indicative of the determined distance. In some embodiments, the processor 1250 can identify an object from which the pulse of light reflected from the object based at least partly on the width of a pulse generated by the TIA 1234. In some embodiments, the processor 1250 can output data identifying the object. In some embodiments, one instance of the processor 1250 may be associated with the receiver signal chain 1230 and another instance of the processor 1250 may be associated with the transmitter signal chain 1210.

The controller 1260 may be used to control aspects of the system 1200, and, in particular, aspects of the present disclosure related to multi-stage TIAs with programmable clamps, described herein. For example, the controller 1260 may generate control signals that control operation of various elements of the multi-stage TIAs with programmable clamps as described herein. In some embodiments, the controller 1260 may be implemented as a data processing system shown in FIG. 13.

Figure 13:
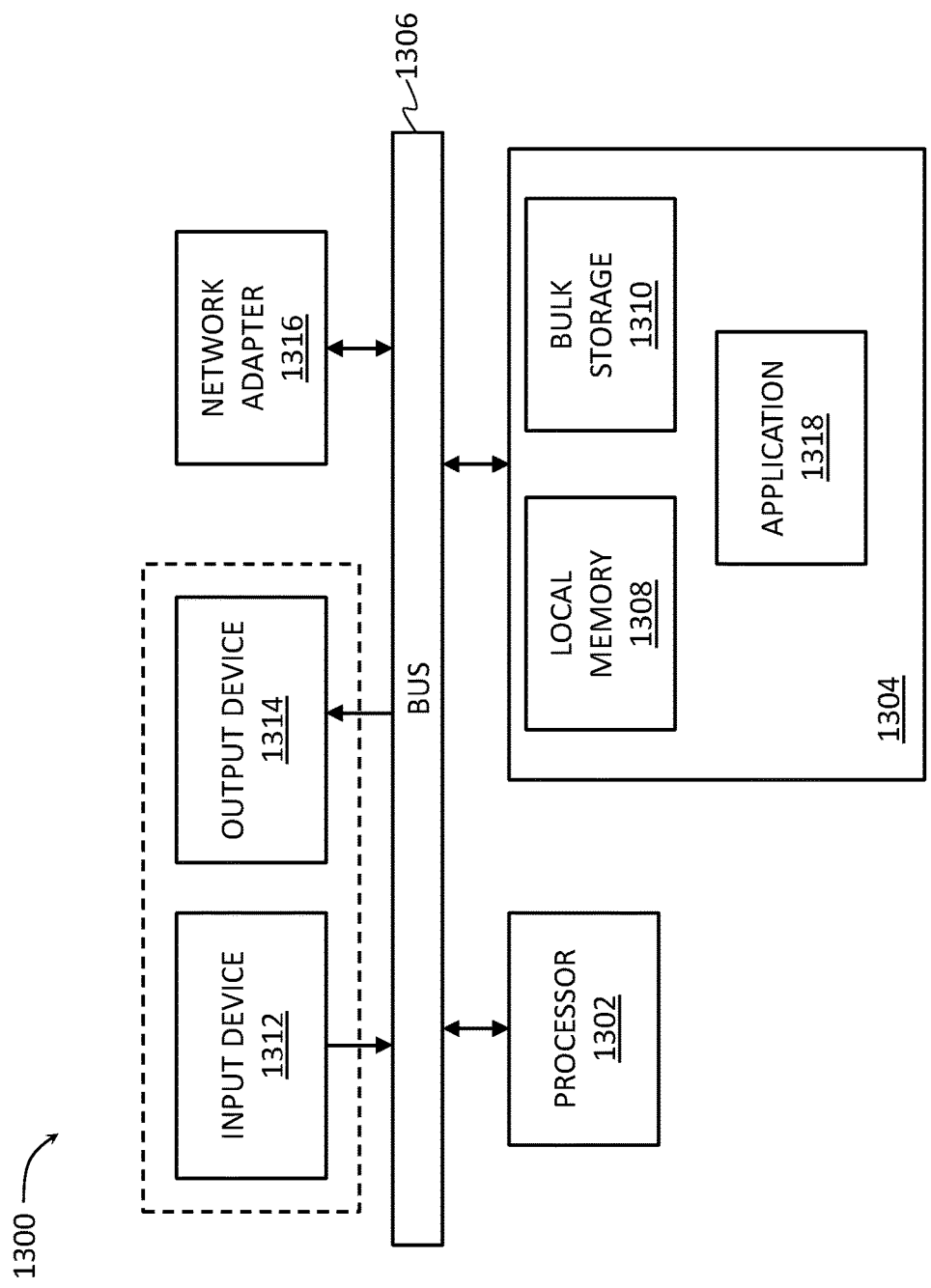
FIG. 13 provides a block diagram illustrating an example data processing system that may be configured to implement, or control, at least portions of processing a received signal using a multi-stage TIA with an adjustable input range, according to some embodiments of the present disclosure.

FIG. 13 provides a block diagram illustrating an example data processing system 1300 that may be configured to implement, or control, at least portions of implementing multi-stage TIAs with adjustable input range realized using programmable clamps, according to some embodiments of the present disclosure. For example, in some embodiments, the data processing system 1300 may be configured to control functionality of the control voltage VCLHI, described herein. In some embodiments, the controller 1260 may be implemented as the data processing system 1300.

As shown in FIG. 13, the data processing system 1300 may include at least one processor 1302, e.g. a hardware processor 1302, coupled to memory elements 1304 through a system bus 1306. As such, the data processing system may store program code within memory elements 1304. Further, the processor 1302 may execute the program code accessed from the memory elements 1304 via a system bus 1306. In one aspect, the data processing system may be implemented as a computer that is suitable for storing and/or executing program code. It should be appreciated, however, that the data processing system 1300 may be implemented in the form of any system including a processor and a memory that is capable of performing the functions described within this disclosure.

In some embodiments, the processor 1302 can execute software or an algorithm to perform the activities as discussed in this specification, in particular activities related to multi-stage TIAs with programmable clamps as described herein. The processor 1302 may include any combination of hardware, software, or firmware providing programmable logic, including by way of non-limiting example a microprocessor, a digital signal processor (DSP), a field-programmable gate array (FPGA), a programmable logic array (PLA), an application specific integrated circuit (IC) (ASIC), or a virtual machine processor. The processor 1302 may be communicatively coupled to the memory element 1304, for example in a direct-memory access (DMA) configuration, so that the processor 1302 may read from or write to the memory elements 1304.

In general, the memory elements 1304 may include any suitable volatile or non-volatile memory technology, including double data rate (DDR) random access memory (RAM), synchronous RAM (SRAM), dynamic RAM (DRAM), flash, read-only memory (ROM), optical media, virtual memory regions, magnetic or tape memory, or any other suitable technology. Unless specified otherwise, any of the memory elements discussed herein should be construed as being encompassed within the broad term "memory." The information being measured, processed, tracked or sent to or from any of the components of the data processing system 1300 could be provided in any database, register, control list, cache, or storage structure, all of which can be referenced at any suitable timeframe. Any such storage options may be included within the broad term "memory" as used herein. Similarly, any of the potential processing elements, modules, and machines described herein should be construed as being encompassed within the broad term "processor." Each of the elements shown in the present figures, e.g., any of the circuits/components shown in FIGS. 5-12, can also include suitable interfaces for receiving, transmitting, and/or otherwise communicating data or information in a network environment so that they can communicate with, e.g., the data processing system 1300 of another one of these elements.

In certain example implementations, mechanisms related to multi-stage TIAs with programmable clamps as outlined herein may be implemented by logic encoded in one or more tangible media, which may be inclusive of non-transitory media, e.g., embedded logic provided in an ASIC, in DSP instructions, software (potentially inclusive of object code and source code) to be executed by a processor, or other similar machine, etc. In some of these instances, memory elements, such as e.g. the memory elements 1304 shown in FIG. 13, can store data or information used for the operations described herein. This includes the memory elements being able to store software, logic, code, or processor instructions that are executed to carry out the activities described herein. A processor can execute any type of instructions associated with the data or information to achieve the operations detailed herein. In one example, the processors, such as e.g. the processor 1302 shown in FIG. 13, could transform an element or an article (e.g., data) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., an FPGA, a DSP, an erasable programmable read-only memory (EPROM), an electrically erasable programmable read-only memory (EEPROM)) or an ASIC that includes digital logic, software, code, electronic instructions, or any suitable combination thereof.

The memory elements 1304 may include one or more physical memory devices such as, for example, local memory 1308 and one or more bulk storage devices 1310.

The local memory may refer to RAM or other non-persistent memory device(s) generally used during actual execution of the program code. A bulk storage device may be implemented as a hard drive or other persistent data storage device. The processing system 1300 may also include one or more cache memories (not shown) that provide temporary storage of at least some program code in order to reduce the number of times program code must be retrieved from the bulk storage device 1310 during execution.

As shown in FIG. 13, the memory elements 1304 may store an application 1318. In various embodiments, the application 1318 may be stored in the local memory 1308, the one or more bulk storage devices 1310, or apart from the local memory and the bulk storage devices. It should be appreciated that the data processing system 1300 may further execute an operating system (not shown in FIG. 13) that can facilitate execution of the application 1318. The application 1318, being implemented in the form of executable program code, can be executed by the data processing system 1300, e.g., by the processor 1302. Responsive to executing the application, the data processing system 1300 may be configured to perform one or more operations or method steps described herein.

Input/output (I/O) devices depicted as an input device 1312 and an output device 1314, optionally, can be coupled to the data processing system. Examples of input devices may include, but are not limited to, a keyboard, a pointing device such as a mouse, or the like. Examples of output devices may include, but are not limited to, a monitor or a display, speakers, or the like. In some embodiments, the output device 1314 may be any type of screen display, such as plasma display, liquid crystal display (LCD), organic light emitting diode (OLED) display, electroluminescent (EL) display, or any other indicator, such as a dial, barometer, or LEDs. In some implementations, the system may include a driver (not shown) for the output device 1314. Input and/or output devices 1312, 1314 may be coupled to the data processing system either directly or through intervening I/O controllers.

In an embodiment, the input and the output devices may be implemented as a combined input/output device (illustrated in FIG. 13 with a dashed line surrounding the input device 1312 and the output device 1314). An example of such a combined device is a touch sensitive display, also sometimes referred to as a "touch screen display" or simply "touch screen". In such an embodiment, input to the device may be provided by a movement of a physical object, such as e.g. a stylus or a finger of a user, on or near the touch screen display.

A network adapter 1316 may also, optionally, be coupled to the data processing system to enable it to become coupled to other systems, computer systems, remote network devices, and/or remote storage devices through intervening private or public networks. The network adapter may comprise a data receiver for receiving data that is transmitted by said systems, devices and/or networks to the data processing system 1300, and a data transmitter for transmitting data from the data processing system 1300 to said systems, devices and/or networks. Modems, cable modems, and Ethernet cards are examples of different types of network adapter that may be used with the data processing system 1300.

Figure 14:
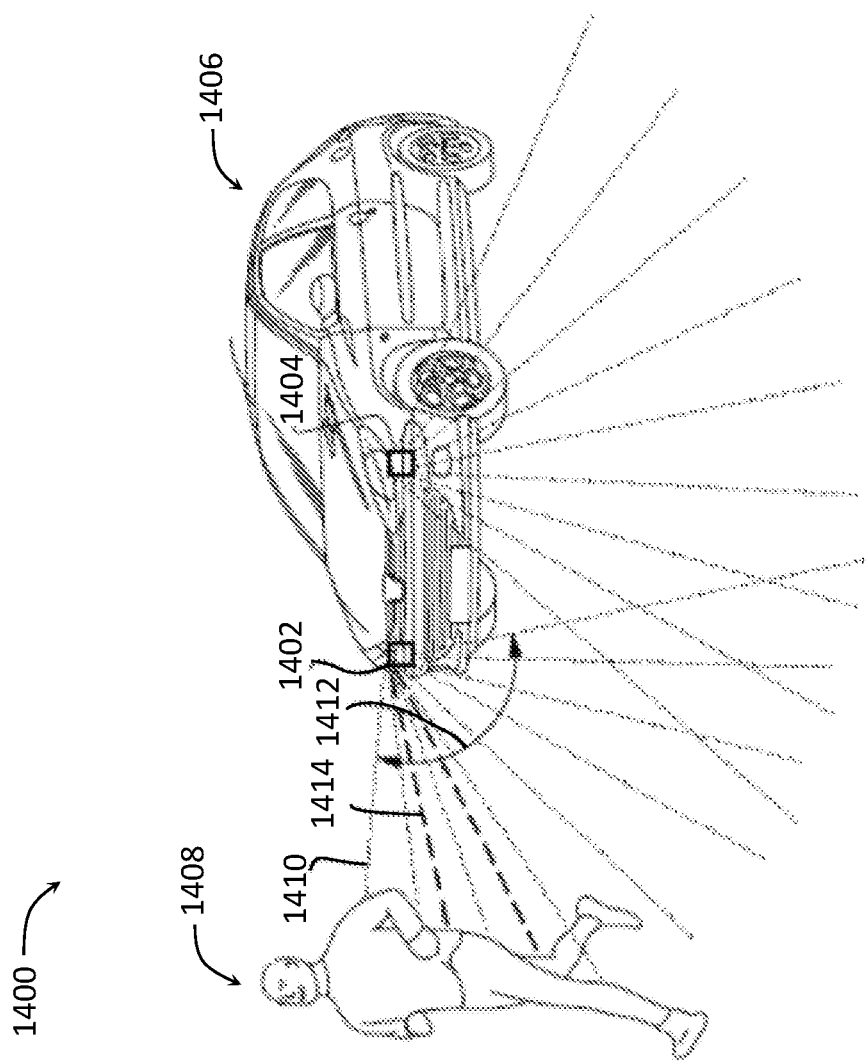
FIG. 14 is an example illustration of a LIDAR system integrated with an automobile, according to some embodiments of the present disclosure.

FIG. 14 provides an illustration 1400 of a LIDAR system integrated with an automobile, according to some embodiments of the present disclosure. This is an example application in which any of the multi-stage TIAs with adjustable input range realized using programmable clamps as described herein can be implemented. FIG. 14 illustrates two LIDAR systems 1402 and 1404 integrated with an automobile 1406. The first LIDAR system 1402 may be positioned near a right headlight of the automobile 1406 and the second LIDAR system 1404 may be positioned near the left headlight of automobile 1406. The LIDAR systems 1402 and/or 1404 can implement any suitable principles of multi-stage TIAs with programmable clamps, as discussed herein. The LIDAR systems 1402 and/or 1404 can detect a distance between the automobile 1406 and an object 1408.

As illustrated, a transmitter of the LIDAR system 1402 can transmit pulses of light 1410 at an angle 1412. At least some of the pulses of light 1410 may be generated by a laser diode, e.g., the laser diode 1220, shown in FIG. 12. The transmitted light 1410 can travel through the air and reach the object 1408. The object 1408 can reflect back pulses of light 1414 to a receiver of the LIDAR system 1402. Embodiments discussed herein can generate information to identify the object 1408. The pulses of light 1410 can be transmitted three dimensionally to obtain three-dimensional information of the surroundings.

One or more additional LIDAR systems can be integrated with the automobile 1406 to cover a wider range of area for detection and/or to obtain additional information regarding a selected area. In some embodiments, data collected by each LIDAR system can be combined to analyze information from a wider range of area and/or to provide additional information about a selected area. In some embodiments, the angle 1412 can be adjusted and the angle 1412 can be in any suitable range.

The illustrations of FIGS. 5-11 provide just some non-limiting example where multi-stage TIAs with adjustable input range as described herein, e.g., various embodiments of the TIA 504, may be used. In other embodiments, the TIA 504 may be implemented in a system other than a LIDAR system as shown in FIG. 5 (i.e., the input current IIN provided to the TIA 504 may be any input current, provided from any other source and not necessarily from the optical sensor 102). Various teachings related to multi-stage TIAs with adjustable input range as described herein are applicable to a large variety of other systems. In some scenarios, various embodiments of multi-stage TIAs with adjustable input range as described herein can be used in automotive systems, safety-critical industrial applications, medical systems, scientific instrumentation, wireless and wired communications, radar, industrial process control, audio and video equipment, current sensing, instrumentation (which can be highly precise), and various digital-processing-based systems. In other scenarios, various embodiments of multi-stage TIAs with adjustable input range as described herein can be used in the industrial markets that include process control systems that help drive productivity, energy efficiency, and reliability. In yet further scenarios, various embodiments of multi-stage TIAs with adjustable input range may be used in consumer applications.

Select Examples

The following paragraphs provide examples of various ones of the embodiments disclosed herein.

Example A1 provides a multi-stage TIA comprising a high-side clamp associated with the first stage.

Example A2 provides the multi-stage TIA according to example A1, wherein the TIA includes coupling between components as shown in FIG. 5.

Example A3 provides the multi-stage TIA according to example A1, wherein the TIA includes coupling between components as shown in FIG. 8.

Example A4 provides an electronic component comprising a multi-stage TIA according to any one of the preceding examples A.

Example A5 provides the electronic component according to example A4, wherein the electronic component is a TIA or an ADC driver.

Example A6 provides the electronic component according to example A4, wherein the electronic component is a LIDAR receiver.

Example B1 provides a system such as a TIA, configured to convert a single-ended current input to a differential voltage output. The system includes a first amplifier circuit (e.g., the amplifier A0 described herein), having an output for providing a first amplifier output generated by the first amplifier circuit based on the single-ended current input; an output offset current generation circuit (e.g., the amplifier A1 described herein), configured to generate an output offset current; a second amplifier circuit (e.g., the amplifier A2 described herein), having a differential input that includes a first input and a second input, and configured to generate the differential voltage output based on receiving a signal based on the first amplifier output at the first input (e.g., at the negative input IN−) of the differential input of the second amplifier circuit, and based on receiving a signal based on the output offset current at the second input (e.g., at the positive input IN+) of the differential input of the second amplifier circuit. The system further includes a clamp circuit, coupled to the output of the first amplifier circuit, and further coupled to a control signal configured to set one of a minimum voltage value or a maximum voltage value for the first amplifier output based on the output offset current generated by the output offset current generation circuit.

In such a system, the clamp circuit is configured to clamp the first amplifier output based on the control signal provided to the clamp circuit to make sure that the first amplifier output does not fall below the minimum voltage or does not exceed the maximum voltage set by the control signal. The clamped version of the first amplifier output is then provided to the first input of the differential input of the second amplifier circuit. Because the second input of the differential input of the second amplifier circuit receives a signal based on the output offset current, and because the first input of the differential input of the second amplifier circuit receives a clamped version of the first amplifier output where the clamping depends on a control signal that is also based on the output offset current, the system can advantageously ensure that the differential input of the second amplifier circuit is not overloaded.

Example B2 provides the system according to example B1, where the first amplifier circuit includes a first transistor (e.g., transistor Q1 shown in FIG. 8 or FIG. 9) and a second transistor (e.g., transistor Q2 shown in FIG. 8 or FIG. 9), and the clamp circuit includes a third transistor (e.g., transistor Q3 shown in FIG. 8 or FIG. 9). In a further example of the system according to example B2, each of the first transistor, the second transistor, and the third transistor includes a first terminal, a second terminal, and a third terminal, where the first terminal of the third transistor is coupled to the third terminal of the second transistor, the first terminal of the second transistor is coupled to the output of the first amplifier circuit, the first amplifier circuit is configured to receive the single-ended current input at the third terminal of the first transistor, and the second terminal of the first transistor is coupled to the third terminal of the second transistor.

Example B3 provides the system according to example B2, where the control voltage signal sets the maximum voltage value, each of the first transistor and the second transistor is an N-type transistor, and the third transistor is a P-type transistor. In a further example of the system according to example B3, the second terminal of the third transistor and the first terminal of the first transistor may be coupled to the negative supply (e.g., Vee for bipolar transistor implementations or VSS for FET implementations), while the second terminal of the second transistor may be coupled to the positive supply (e.g., Vcc for bipolar transistor implementations or VDD for FET implementations).

Example B4 provides the system according to example B3, where the control signal is based on a positive supply voltage for the first amplifier circuit and the clamp circuit (e.g., on voltage Vcc for bipolar transistor implementations, or voltage VDD for FET implementations).

Example B5 provides the system according to example B2, where the control voltage signal sets the minimum voltage value, each of the first transistor and the second transistor is a P-type transistor, and the third transistor is an N-type transistor. In a further example of the system according to example B5, the second terminal of the third transistor and the first terminal of the first transistor may be coupled to the positive supply (e.g., Vcc for bipolar transistor implementations or VDD for FET implementations), while the second terminal of the second transistor may be coupled to the negative supply (e.g., Vee for bipolar transistor implementations or VSS for FET implementations).

Example B6 provides the system according to example B5, where the control signal is based on a negative supply voltage for the first amplifier circuit and the clamp circuit (e.g., on voltage Vee for bipolar transistor implementations, or voltage VSS for FET implementations).

Example B7 provides the system according to any one of examples B2-B6, where the control signal is configured to set one of the minimum voltage value or the maximum voltage value for the first amplifier output further based on a voltage difference between the first terminal and the third terminal of the first transistor (e.g., on voltage $V_{BE,Q1}$ if Q1 is a bipolar transistor). In other examples B, the control signal is configured to set one of the minimum voltage value or the maximum voltage value for the first amplifier output further based on $V_{min,A0}$, which depends on Vee.

Example B8 provides the system according to any one of examples B2-B7, where the control signal is configured to set one of the minimum voltage value or the maximum voltage value for the first amplifier output further based on a voltage difference between the first terminal and the third terminal of the second transistor (e.g., on voltage $V_{BE,Q2}$ if Q2 is a bipolar transistor). In other examples B, the control signal is configured to set one of the minimum voltage value or the maximum voltage value for the first amplifier output further based on $V_{max,A0}$, which depends on Vcc.

Example B9 provides the system according to any one of examples B2-B8, where the control signal is configured to set one of the minimum voltage value or the maximum voltage value for the first amplifier output further based on a resistance of a feedback component (e.g., the resistor RT across the amplifier A0) having a first terminal coupled to the third terminal of the first transistor (i.e., coupled to the input of the first amplifier circuit) and having a second terminal coupled to the third terminal of the second transistor (i.e., coupled to the output of the first amplifier circuit).

Example B10 provides the system according to any one of examples B2-B9, where, for any transistor of the first transistor, the second transistor, and the third transistor that is a bipolar transistor, the first terminal is an emitter terminal, the second terminal is a collector terminal, and the third terminal is a base terminal.

Example B11 provides the system according to any one of examples B2-B10, where, for any transistor of the first transistor, the second transistor, and the third transistor that is a field-effect transistor (FET), the first terminal is a source terminal, the second terminal is a drain terminal, and the third terminal is a gate terminal.

Example B12 provides the system according to any one of examples B1-B11, where the control signal is a control voltage signal.

Example B13 provides the system according to any one of examples B1-B11, where the control signal is a control current signal.

Example B14 provides the system according to any one of the preceding examples B, where the system is a driver for an analog-to-digital converter.

In a further example B, the system according to any one of the preceding examples B may be a LIDAR system.

Example B15 provides a system such as a TIA, configured to convert a single-ended current input to a differential voltage output, the system including a first stage, configured to receive the single-ended current input and generate a single-ended output based on the single-ended current input; a clamp circuit, configured to generate a clamped single-ended output by clamping the single-ended output either 1) if/when the single-ended output exceeds a maximum voltage value (if the single-ended output does not exceed the maximum voltage value then the clamped single-ended output is the same as the single-ended output generated by the first stage), where the maximum voltage value is based on an output offset current, or 2) if/when the single-ended output falls below a minimum voltage value (if the single-ended output does not fall below the minimum voltage value then the clamped single-ended output is the same as the single-ended output generated by the first stage), where the minimum voltage value is based on the output offset current. The system further includes a second stage, configured to receive a signal based on the clamped single-ended output as a first input of a differential input of the second stage, receive a signal based on the output offset current as a second input of the differential input of the second stage, and generate the differential voltage output based on the differential input.

Example B16 provides the system according to example B15, where each of the single-ended output, the clamped single-ended output, and the signal based on the output offset current is a voltage signal.

Example B17 provides the system according to examples B15 or B16, where the first stage includes an amplifier, having an input for receiving the single-ended current input, and having an output for providing the single-ended output, and a feedback resistor, having a first terminal coupled to the input of the amplifier, and having a second terminal coupled to the output of the amplifier.

Example B18 provides the system according to any one of examples B15-B17, further including a circuit configured to generate the output offset current.

Example B19 provides the system according to example B18, where the circuit is coupled to a control voltage, and the circuit is a voltage-to-current converter, configured to generate the output offset current based on the control voltage.

Example B20 provides a system configured to convert a single-ended signal to a differential signal, the system including an amplifier and a clamp circuit, where the amplifier has a differential input and a differential output, a first input of the differential input of the amplifier is configured to receive a signal that is based on the single-ended signal that has been clamped by the clamp circuit based on a clamp control signal, where the clamp control signal is based on an output offset current, a second input of the differential input of the amplifier is configured to receive a signal based on the output offset current, and the amplifier is configured to generate the differential signal based on the signals received at the differential input of the amplifier.

Example B21 provides the system according to example B20, where the system further includes features according to one of more of examples B1-B19.

Example B22 provides the system according to examples B20 or B21, where the system is a driver for an ADC or a LIDAR system.

Example B23 provides a method, including steps performed by a system or a device according to any one of the preceding examples.

Example B24 provides a method, including steps that cause a system to operate according to any one of the preceding examples.

Example B25 provides a non-transitory computer-readable storage medium storing instructions which, when executed by a processor, cause the processor to perform at least portions of the methods according to any one of examples B23 and B24.

Example B26 provides a computer program product including instructions which, when executed by a processor, cause the processor to perform at least portions of the methods according to any one of examples B23 and B24.

Other Implementation Notes, Variations, and Applications

Principles and advantages discussed herein can be used in any device where limiting of TIA output may need to take place. For example, aspects of this disclosure can be implemented in various range finding systems. For example, aspects of this disclosure can be implemented in any suitable LIDAR system such as, for example, automotive LIDAR, industrial LIDAR, space LIDAR, military LIDAR, etc. LIDAR systems can include a receiver or a transmitter and a receiver. LIDAR systems can be integrated with a vehicle, such as an automobile, a drone such as an unmanned flying machine, an autonomous robot, or a space vehicle. LIDAR systems can transmit and/o receive laser light. LIDAR systems can be used for three-dimensional sensing applications. LIDAR systems can be used with augmented reality technology. Moreover, aspects of this disclosure can be implemented in various electronic devices. Examples of the electronic devices can include, but are not limited to, electronic products, parts of electronic products such as integrated circuits, vehicular electronics such as automotive electronics, etc. Further, the electronic devices can include unfinished products.

While certain embodiments have been described, these embodiments have been presented by way of example, and are not intended to limit the scope of the disclosure. For example, while some embodiments refer to an APD being coupled to an input port of a TIA, these embodiments are equally applicable to any other device that can generate current pulses to be provided to an input of a TIA, e.g., to any other type of a PD. In another example, while some embodiments may refer to a PD that sinks current from the TIA, these embodiments may be modified, in a way that would be obvious to a person of ordinary skill in the art, to a PD that sources current to the TIA, all of which embodiments being, therefore, within the scope of the present disclosure. Indeed, the novel methods, apparatus, and systems related to multi-stage TIAs with programmable clamps, described herein, may be embodied in a variety of other forms. Furthermore, various omissions, substitutions and changes in the form of the methods, apparatus, and systems described herein may be made without departing from the spirit of the disclosure. For example, circuit blocks and/or circuit elements described herein may be deleted, moved, added, subdivided, combined, and/or modified. Each of these circuit blocks and/or circuit elements may be implemented in a variety of different ways. The accompanying claims and their equivalents are intended to cover any such forms or modifications as would fall within the scope and spirit of the disclosure.

Any of the principles and advantages discussed herein can be applied to other systems, devices, integrated circuits, electronic apparatus, methods, not just to the embodiments described above. The elements and operations of the various embodiments described above can be combined to provide further embodiments. The principles and advantages of the embodiments can be used in connection with any other systems, devices, integrated circuits, apparatus, or methods that could benefit from any of the teachings herein.

It is to be understood that not necessarily all objects or advantages may be achieved in accordance with any particular embodiment described herein. Thus, for example, those skilled in the art will recognize that certain embodiments may be configured to operate in a manner that achieves or optimizes one advantage or group of advantages as taught herein without necessarily achieving other objects or advantages as may be taught or suggested herein.

In one example embodiment, any number of electrical circuits of the FIGS. may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, controllers for configuring any of the components, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits described herein may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the electrical circuits described herein may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular arrangements of components. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGS. may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGS. and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

Numerous other changes, substitutions, variations, alterations, and modifications may be ascertained to one skilled in the art and it is intended that the present disclosure encompass all such changes, substitutions, variations, alterations, and modifications as falling within the scope of the appended select examples. Note that all optional features of the apparatus described above may also be implemented with respect to the method or process described herein and specifics in the examples may be used anywhere in one or more embodiments.

The invention claimed is:

1. A system to convert a single-ended current input to a differential voltage output, the system comprising:
a first amplifier circuit, having an output for providing a first amplifier output generated by the first amplifier circuit based on the single-ended current input;
a second amplifier circuit, having an input to receive an output offset current;

a third amplifier circuit, having a differential input that includes a first input and a second input, and generate the differential voltage output based on:
  receiving, at the first input, a signal based on the first amplifier output, and
  receiving, at the second input, a signal generated by the second amplifier circuit based on the output offset current received by the second amplifier circuit; and
a clamp circuit, having an input to receive the output offset current, the clamp circuit coupled to the output of the first amplifier circuit, and further coupled to a control signal to set one of a minimum voltage value or a maximum voltage value for the first amplifier output based on the output offset current received at the input of the clamp circuit.

2. The system according to claim 1, wherein:
the first amplifier circuit includes a first transistor and a second transistor,
the clamp circuit includes a third transistor,
each of the first transistor, the second transistor, and the third transistor includes a first terminal, a second terminal, and a third terminal,
the first terminal of the third transistor is coupled to the third terminal of the second transistor,
the first terminal of the second transistor is coupled to the output of the first amplifier circuit,
the first amplifier circuit is to receive the single-ended current input at the third terminal of the first transistor, and
the second terminal of the first transistor is coupled to the third terminal of the second transistor.

3. The system according to claim 2, wherein:
the control signal is to set the maximum voltage value,
each of the first transistor and the second transistor is an N-type transistor, and
the third transistor is a P-type transistor.

4. The system according to claim 3, wherein the control signal is based on a positive supply voltage for the first amplifier circuit and the clamp circuit.

5. The system according to claim 2, wherein:
the control signal is to set the minimum voltage value,
each of the first transistor and the second transistor is a P-type transistor, and
the third transistor is an N-type transistor.

6. The system according to claim 5, wherein the control signal is based on a negative supply voltage for the first amplifier circuit and the clamp circuit.

7. The system according to claim 2, wherein the control signal is to set one of the minimum voltage value or the maximum voltage value for the first amplifier output further based on a voltage difference between the first terminal and the third terminal of the first transistor.

8. The system according to claim 2, wherein the control signal is to set one of the minimum voltage value or the maximum voltage value for the first amplifier output further based on a voltage difference between the first terminal and the third terminal of the second transistor.

9. The system according to claim 2, wherein the control signal is to set one of the minimum voltage value or the maximum voltage value for the first amplifier output further based on a resistance of a feedback component having a first terminal coupled to the third terminal of the first transistor and having a second terminal coupled to the first terminal of the second transistor.

10. The system according to claim 2, wherein, for any transistor of the first transistor, the second transistor, and the third transistor that is a bipolar transistor, the first terminal is an emitter terminal, the second terminal is a collector terminal, and the third terminal is a base terminal.

11. The system according to claim 2, wherein, for any transistor of the first transistor, the second transistor, and the third transistor that is a field-effect transistor (FET), the first terminal is a source terminal, the second terminal is a drain terminal, and the third terminal is a gate terminal.

12. The system according to claim 1, wherein the control signal is a control voltage signal.

13. The system according to claim 1, wherein the control signal is a control current signal.

14. The system according to claim 1, wherein the system is a driver for an analog-to-digital converter.

15. The system according to claim 1, wherein the system is a light detection and ranging (LIDAR) system.

16. A system to convert a single-ended current input to a differential voltage output, the system comprising:
a first amplifier circuit, having an output for providing a first amplifier output generated by the first amplifier circuit based on the single-ended current input;
a second amplifier circuit, having a differential input that includes a first input and a second input, the second amplifier circuit to generate the differential voltage output based on:
  receiving a signal based on the first amplifier output at the first input, and
  receiving a signal based on an output offset current at the second input; and
a clamp circuit, coupled to the output of the first amplifier circuit, and further coupled to a control signal that is to set one of a minimum voltage value or a maximum voltage value for the first amplifier output based on the output offset current,
wherein:
  the first amplifier circuit includes a first transistor and a second transistor,
  the clamp circuit includes a third transistor,
  each of the first transistor, the second transistor, and the third transistor includes a first terminal, a second terminal, and a third terminal,
  the first terminal of the third transistor is coupled to the third terminal of the second transistor,
  the first terminal of the second transistor is coupled to the output of the first amplifier circuit,
  the first amplifier circuit is to receive the single-ended current input at the third terminal of the first transistor, and
  the second terminal of the first transistor is coupled to the third terminal of the second transistor.

17. The system according to claim 16, wherein the control signal is to set one of the minimum voltage value or the maximum voltage value for the first amplifier output based on at least one of:
a voltage difference between the first terminal and the third terminal of the first transistor,
a voltage difference between the first terminal and the third terminal of the second transistor, and
a resistance of a feedback component having a first terminal coupled to the third terminal of the first transistor and having a second terminal coupled to the first terminal of the second transistor.

18. The system according to claim 16, wherein:
for any transistor of the first transistor, the second transistor, and the third transistor that is a bipolar transistor, the first terminal is an emitter terminal, the second terminal is a collector terminal, and the third terminal is a base terminal, and for any transistor of the first transistor, the second transistor, and the third transistor that is a field-effect transistor (FET), the first terminal is a source terminal, the second terminal is a drain terminal, and the third terminal is a gate terminal.

19. A system to convert a single-ended current input to a differential voltage output, the system comprising:
a first amplifier circuit, comprising a first transistor and a second transistor, and having an output for providing a first amplifier output generated by the first amplifier circuit based on the single-ended current input;
a second amplifier circuit, having an input to receive an output offset current;
a third amplifier circuit, having a differential input that includes a first input and a second input, and to generate the differential voltage output based on:
receiving, at the first input, a signal based on the first amplifier output, and
receiving, at the second input, a signal generated by the second amplifier circuit based on the output offset current received by the second amplifier circuit; and
a clamp circuit, comprising a third transistor, the clamp circuit coupled to the output of the first amplifier circuit, and further coupled to a control signal to set one of a minimum voltage value or a maximum voltage value for the first amplifier output based on the output offset current,
wherein:
when the control signal is to set the maximum voltage value, each of the first transistor and the second transistor is an N-type transistor, and the third transistor is a P-type transistor, and
when the control signal is to set the minimum voltage value, each of the first transistor and the second transistor is a P-type transistor, and the third transistor is an N-type transistor.

20. The system according to claim 19, wherein the control signal is to set one of the minimum voltage value or the maximum voltage value for the first amplifier output based on a voltage difference between the first terminal and the third terminal of the first transistor.

21. The system according to claim 16, wherein the system is a driver for an analog-to-digital converter.

22. The system according to claim 16, wherein the system is a light detection and ranging (LIDAR) system.

23. The system according to claim 19, wherein the system is a driver for an analog-to-digital converter.

24. The system according to claim 19, wherein the system is a light detection and ranging (LIDAR) system.

* * * * *